United States Patent
Varel et al.

(10) Patent No.: US 10,965,027 B2
(45) Date of Patent: Mar. 30, 2021

(54) RF RIPPLE CORRECTION IN AN ANTENNA APERTURE

(71) Applicant: Kymeta Corporation, Redmond, WA (US)

(72) Inventors: Cagdas Varel, Seattle, WA (US); Ryan Stevenson, Woodinville, WA (US); Michael Severson, Seattle, WA (US)

(73) Assignee: KYMETA CORPORATION, Redmond, WA (US)

( * ) Notice: Subject to any disclaimer, the term of this patent is extended or adjusted under 35 U.S.C. 154(b) by 154 days.

(21) Appl. No.: 16/134,197

(22) Filed: Sep. 18, 2018

(65) Prior Publication Data

US 2019/0089050 A1    Mar. 21, 2019

Related U.S. Application Data

(60) Provisional application No. 62/561,110, filed on Sep. 20, 2017, provisional application No. 62/564,877, filed on Sep. 28, 2017.

(51) Int. Cl.
*H01Q 3/28* (2006.01)
*H01Q 3/36* (2006.01)
(Continued)

(52) U.S. Cl.
CPC ............. *H01Q 3/28* (2013.01); *G01R 29/10* (2013.01); *H01Q 1/38* (2013.01); *H01Q 3/005* (2013.01); *H01Q 3/24* (2013.01); *H01Q 3/247* (2013.01); *H01Q 3/34* (2013.01); *H01Q 3/36* (2013.01); *H01Q 13/103* (2013.01); *H01Q 17/001* (2013.01); *H01Q 21/0012* (2013.01);
(Continued)

(58) Field of Classification Search
CPC ........... H01Q 1/38; H01Q 3/005; H01Q 3/24; H01Q 3/28; H01Q 3/247; H01Q 3/34; H01Q 3/36; H01Q 17/001; H01Q 21/0012; H01Q 21/065; H03D 3/008; G01R 29/10
See application file for complete search history.

(56) References Cited

U.S. PATENT DOCUMENTS

2003/0184476 A1    10/2003    Sikina et al.
2011/0109387 A1    5/2011    Lee
(Continued)

FOREIGN PATENT DOCUMENTS

CN    205451751 U    8/2016
WO    2017130489 A1    8/2017

OTHER PUBLICATIONS

International Search Report and Written Opinion received for PCT Patent Application No. PCT/US2018/051811, dated Jan. 11, 2019, 18 pages.
(Continued)

*Primary Examiner* — Dao L Phan
(74) *Attorney, Agent, or Firm* — Womble Bond Dickinson (US) LLP

(57) ABSTRACT

A method and apparatus for RF ripple correction in an antenna aperture are described. In one embodiment, the antenna comprises: an array of antenna elements having liquid crystal (LC); drive circuitry coupled to the array and having a plurality of drivers, each driver of the plurality of drivers coupled to an antenna element of the array and operable to apply a drive voltage to the antenna element; and radio-frequency (RF) ripple correction logic coupled to the drive circuitry to adjust drive voltages to compensate for ripple.

22 Claims, 23 Drawing Sheets

(51) Int. Cl.
| | |
|---|---|
| G01R 29/10 | (2006.01) |
| H01Q 17/00 | (2006.01) |
| H01Q 3/00 | (2006.01) |
| H01Q 3/24 | (2006.01) |
| H01Q 1/38 | (2006.01) |
| H01Q 3/34 | (2006.01) |
| H01Q 13/10 | (2006.01) |
| H01Q 21/00 | (2006.01) |
| H01Q 21/06 | (2006.01) |
| H03D 3/00 | (2006.01) |
| G01R 29/08 | (2006.01) |
| G01R 31/28 | (2006.01) |

(52) U.S. Cl.
CPC ......... *H01Q 21/064* (2013.01); *H01Q 21/065* (2013.01); *H03D 3/008* (2013.01); *G01R 29/0892* (2013.01); *G01R 31/2822* (2013.01)

(56) References Cited

U.S. PATENT DOCUMENTS

| | | |
|---|---|---|
| 2013/0106378 A1 | 5/2013 | Khlat |
| 2016/0056982 A1 | 2/2016 | Wang et al. |
| 2016/0233588 A1 | 8/2016 | Bily et al. |

OTHER PUBLICATIONS

International Preliminary Report on Patentability for Application No. PCT/US2018/051811 dated Apr. 2, 2020, 11 pages.
Chinese Office Action on the Patentability of Application No. 201880061452.7, dated Sep. 30, 2020, 18 pages.

RF RIPPLE CORRECTION IN AN ANTENNA APERTURE

PRIORITY

The present patent application claims priority to and incorporates by reference the corresponding provisional patent application Ser. No. 62/561,110, titled, "RF RIPPLE CORRECTION," filed on Sep. 20, 2017 and provisional patent application Ser. No. 62/564,877, titled, "DC OFFSET CORRECTION IN AN RF TFT ANTENNA APERTURE," filed on Sep. 28, 2017.

FIELD OF THE INVENTION

Embodiments of the present invention relate to the field of radio frequency (RF) devices having liquid crystals (LCs); more particularly, embodiments of the present invention relate to the driving and control of radio frequency (RF) devices having liquid crystals (LCs) for which RF ripple, flicker or other observations have been made.

BACKGROUND OF THE INVENTION

Display devices using liquid crystals (LC) typically use a drive method that inverts the polarity of the drive voltage applied across the LC at regular intervals. These intervals are typically called time frames or frames. This is done to prevent or minimize trapping of charges within the LC device that can result in a storage of a voltage within the LC device. These charges arise from numerous sources, mostly coming from contamination or a degradation of materials in the LC device. A persistent application of a given polarity separates the charges of contaminants (such as organic acids), and moves them to the boundaries of the LC device, where they may stick. By inverting the polarity of the applied voltage, the separation and transport of these charged species can be reduced. However, inverting the voltage symmetrically is difficult to do, and thus a "net DC offset" results.

A condition called "flicker" can also occur, which is caused when there is a sufficient difference between the absolute value of the voltage applied during a positive frame and that applied during a negative frame such that the optical properties of the LC in positive and negative frames are different and visible by a human eye. In a display, these may be seen or detected by a light sensing device. Over time, the asymmetry between the positive and negative frames that caused flicker results in storage charge. Stored charge within the device can create differences between the voltage that is intended to be applied to the LC, and the voltage that is actually applied. This can result in a reduction in the root mean squared (RMS) voltage applied to the elements. Another symptom of this problem, referred to herein as "image sticking", can occur, which is an influence of a previously applied image pattern upon the next image pattern.

Although regularly inverting the polarity of the applied voltage is effective to prevent charge trapping, this by itself is not sufficient to prevent problems like "flicker". If there is a sustained difference between the applied voltages in the positive polarity and the negative polarity, this can result in a "net DC offset" between the frames, whereby there is a net accumulation of charges at the boundaries of the LC device over time.

To prevent this in an LC-based device, it is desired that the DC offset between the absolute value of voltage applied to the LC device during the one interval of the drive polarity and the absolute value of the voltage applied during the next interval of opposite drive polarity be as close to zero as possible.

In LC displays, adjustment of the DC offset may be done by compensating the voltage value sent to each element for each polarity at every gray level. In a display, the amount of the compensation voltage at each polarity at chosen gray levels may be determined optically and is selected to null the flicker. That is, a voltage difference between the positive and negative polarity of frames results in an optical flicker, which can be observed by an optical sensor or array of sensors (camera) and nulled using a correction algorithm in an automated test setup. Then, those correction values can be stored and used for minimizing the offset.

A DC offset problem is described above for LC displays. The same phenomenon is observed in LC RF antenna since LC driving mechanism is the same as displays. The effect of this phenomenon is observed as RF ripple in the antenna performance which degrades the carrier to noise (C/N) ratio at the receiver. DC offset correction methods used in LC displays cannot be applied to the current state of the LC RF antenna because the antenna structure blocks the path for optical measurements of the LC response.

SUMMARY OF THE INVENTION

A method and apparatus for RF ripple correction in an antenna aperture are described. In one embodiment, the antenna comprises: an array of antenna elements having liquid crystal (LC); drive circuitry coupled to the array and having a plurality of drivers, each driver of the plurality of drivers coupled to an antenna element of the array and operable to apply a drive voltage to the antenna element; and radio-frequency (RF) ripple correction logic coupled to the drive circuitry to adjust drive voltages to compensate for ripple.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Overview of Voltage Correction

A method and apparatus for controlling the drive scheme of an antenna is disclosed. In one embodiment, the antenna comprises a flat panel antenna, such as described, for example, but not limited to, antenna embodiments described below. Note that the techniques described herein are not limited to such an antenna.

In one embodiment, the drive scheme involves the selection of voltage values for controlling antenna elements in an antenna. In one embodiment, the antenna elements are RF radiating antenna elements; however, the techniques disclosed herein are not limited to such antenna elements. In one embodiment, the RF radiating antenna elements are metamaterial liquid crystal-based antenna elements. In one embodiment, the metamaterial antenna elements are surface scattering metamaterial antenna elements, such as those, for example, but not limited to, those disclosed in more detail below.

In one embodiment, the drive scheme for an antenna is modified based on observations made with respect to the antenna. The observations may be obtained by test equipment, test structures, and sensors. In one embodiment, the observations include observations regarding radio-frequency (RF) ripple, flicker, and/or environmental changes (e.g., temperature changes, pressure changes, etc.).

Based on the observations, changes to the drive scheme are made. In one embodiment, one or more changes to the drive scheme involve adjusting one or more voltages that control the operation of some portion of the antenna. In one embodiment, the adjustment is made to one or more of gamma voltages, gate, source and/or drain voltages of a transistor (e.g., a thin film transistor (TFT)), a reference, or common, voltage (e.g., Vcom), etc.

In the case of RF ripple and/or flicker observations, the techniques disclosed herein adjust voltage values that are specified to controlling antenna elements, including the drivers for such antenna elements. In one embodiment, gamma voltage values are adjusted. In another embodiment, a common voltage, e.g., Vcom, value is adjusted. Note that the voltage adjustments are not limited to these voltages.

Figure 1:
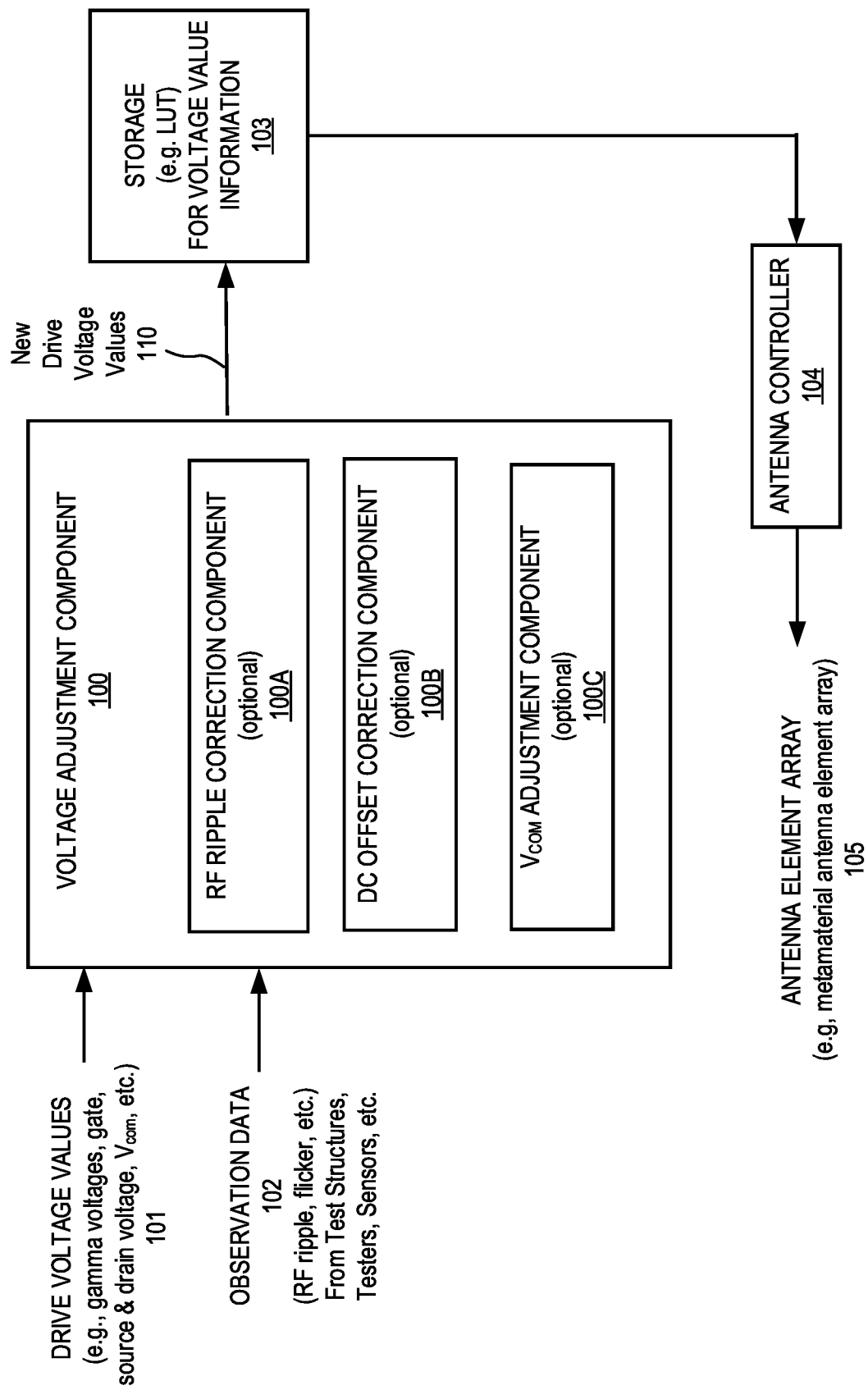
FIG. 1 is a block diagram of one embodiment of voltage adjustment apparatus.

FIG. 1 is a block diagram of one embodiment of voltage adjustment apparatus. In one embodiment, the apparatus is part of an antenna. In another embodiment, the apparatus is used by the antenna but is separate from the antenna. In yet another embodiment, parts of the apparatus are distributed such that a portion is part of an antenna and another part is separate from but used by an antenna.

Referring to FIG. 1, voltage adjustment component 100 receives one or more drive/control voltage values 101 (e.g., gamma voltage values, gate, source and/or drain voltages of a transistor (e.g., a thin film transistor (TFT)), a reference, or common, voltage (e.g., Vcom), etc.) and observation data 102 related to observations made with respect to an antenna. In one embodiment, observation data 102 comprises one or more of RF ripple measurements or information, flicker measurements or information, environmental measurements, etc. These may be obtained from testers, test structures, sensors, etc.

In response to these inputs, voltage adjustment component 100 performs voltage adjustments to the drive and/or control voltages used by the antenna. In one embodiment, voltage adjustment component 100 performs voltage adjustments in response to RF ripple that has been observed. In another embodiment, voltage adjustment component 100 performs voltage adjustments in response to a flicker that has been observed. In yet another embodiment, voltage adjustment component 100 performs voltage adjustments in response to RF ripple and flicker that has been observed.

In one embodiment, voltage adjustment component 100 performs voltage adjustments in response to RF ripple that has been observed using an RF ripple correction component 100A. In another embodiment, voltage adjustment component 100 performs voltage adjustments in response to a flicker that has been observed using a DC offset correction component 100B. In yet another embodiment, voltage adjustment component 100 performs voltage adjustments in response to RF ripple and flicker that has been observed using a combined RF ripple and DC offset correction component in which RF ripple correction component 100A and DC offset correction component 100B are combined or work in series. In one embodiment, the two methods are combined such that the optical DC offset correction/detection method (100B) is used to establish expected gamma voltage correction amounts and then a finer correction with RF ripple method (100A) is performed around those expected values. The amount of voltage correction found using 100B may be different than what's needed for RF elements in the array if the test structures are placed only in the periphery or the capacitance of the ITO structure is close but different from RF elements. The combination of two methods can provide more precise correction (100A) in a shorter time (100B), without scanning the whole voltage range. In one embodiment, voltage adjustment component 100 comprises a reference or common voltage Vcom adjustment component 100C to adjust the common voltage. This adjustment may be made based on one or more observations (e.g., RF ripple, flicker, etc.).

Voltage adjustment component 100 outputs one or more new, or updated, drive/control voltage values 110 that are stored in memory 103 (e.g., a look up table (LUT)) for access by an antenna controller 104, which uses the voltage values for use in driving and controlling antenna elements in an array 105 in a manner well-known in the art.

Examples related to embodiments for ripple correction and DC offset correction performed by voltage adjustment component 100 or used by other antenna embodiments are described in more detail below.

Overview of Ripple Correction

In one embodiment, an LC-based antenna aperture uses a driving scheme that inverts the polarity of the differential voltage applied on the liquid crystal (LC) periodically. The LC-based antenna aperture is, for example, but not limited to, an antenna aperture described in more detail below. In one embodiment, the polarity of the LC differential voltage is inverted in regular time intervals referred to herein as frames. Voltage polarity inversion is applied to prevent accumulation of charges in LC on the electrode surfaces (e.g., patch electrodes in a patch/slot pairs of LC-based antenna elements (e.g., surface scattering antenna elements described below)). This accumulation causes a buildup of a voltage within the LC layer and interfere with the device characteristics. The inversion of the voltage polarity in each frame prevents that accumulation as it's moving the charges around in each frame. Those charges are present in the LC mostly due to contamination or material degradation products. For example, there may be degradation of the LC material that results from exposure to UV in the antenna aperture segment assembly process, reaction of the LC with unintentionally exposed metal, reaction of the LC and alignment layers, etc.

The difference in applied voltage is observed as a difference in optical property of LC between a positive frame and a negative frame. Another effect, RF ripple, is observed in the LC antenna aperture when there is a noticeable difference between differential voltage applied on LC in a positive frame and a negative frame. RF ripple in an antenna aperture having antenna elements with liquid crystal is analogous to flicker in liquid crystal displays (LCDs). In the LC antenna aperture, the difference in applied voltage is observed as a difference in the LC dielectric property and eventually the antenna frequency. The difference in the applied differential LC voltage may be due to differences in leakage through transistor or LC, RC delay in the array, cross-talk between elements and difference of "kickback" (or feedthrough) voltage between positive and negative frames. This difference in antenna frequency causes an antenna response which is varying periodically in time. It can be observed that the center frequency of the antenna, the frequency where the highest gain is observed, is changing periodically. A testing tool can measure the RF ripple effect.

Figure 2:
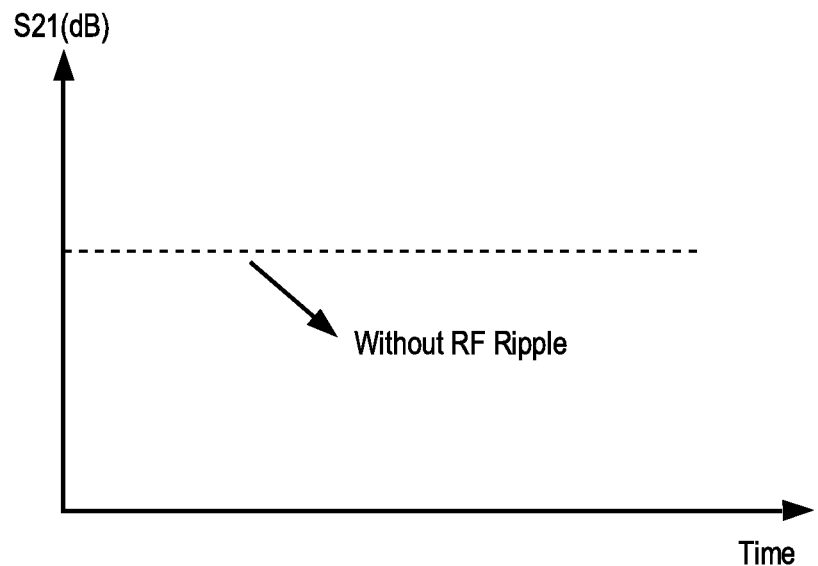
FIG. 2 illustrates the transmission parameter S21 over time without radio-frequency (RF) ripple.
Figure 3:
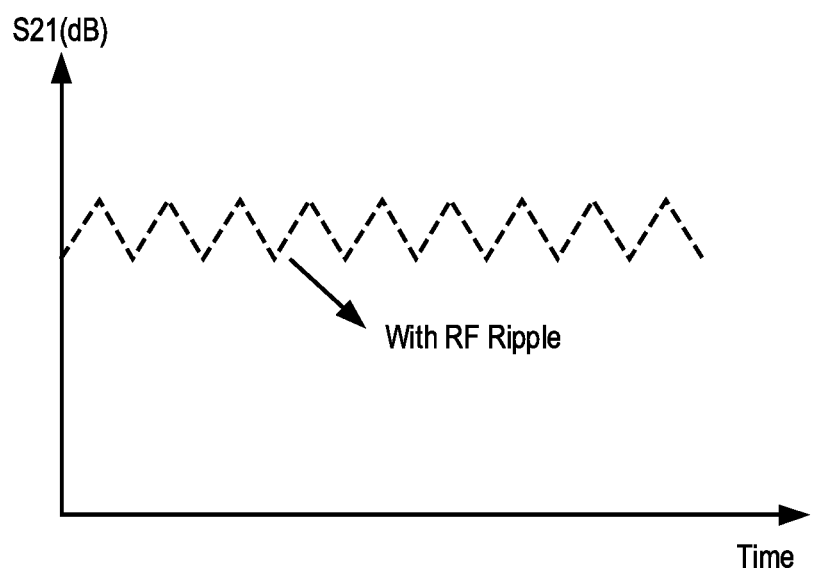
FIG. 3 illustrates the transmission parameter S21 over time with RF ripple.

The RF ripple phenomenon is more clearly observed in time domain, continuous wave (CW) measurements performed at the center frequency. In an ideal case, the transmission parameter (S21) should be constant over time as shown in FIG. 2 for one embodiment of an LC-based antenna aperture. When RF ripple is present, a time dependent periodic change in S21 is observed as shown in FIG. 3 for one embodiment of an LC-based antenna aperture. As previously mentioned, the periodic change in applied voltage changes the center frequency, which causes a periodic change in the transmission parameter measured at a constant frequency.

In one embodiment, the voltage correction techniques disclosed herein correct for RF ripple in an RF antenna aperture. In one embodiment, in order to correct for the RF ripple effect, a voltage correction process is used to automate gamma voltage correction, using an RF free space test tool, such as, for example, but not limited to the tool disclosed in U.S. application Ser. No. 15/596,370, filed on May 16, 2017 and entitled "Free Space Segment Tester (FSST)". The automation of gamma voltage correction is used for the purposes of reducing, minimizing and/or eliminating the phenomenon of RF ripple. Note that this process may be performed one or more times. In one embodiment, the process is repeated when a significant change has occurred, such as, for example, a drastic environmental change captured using, for example, one or both of temperature sensors and/or pressures sensors.

In one embodiment, the voltage correction unit performs a voltage adjustment method. In one embodiment, the method reduces, and potentially minimizes, the RF ripple by readjusting the driving voltages to apply the same differential voltage in both a positive and a negative frame. In one embodiment, the voltage adjustment method for RF ripple correction is applied in a free space test (FST) measurement system.

Figure 4:
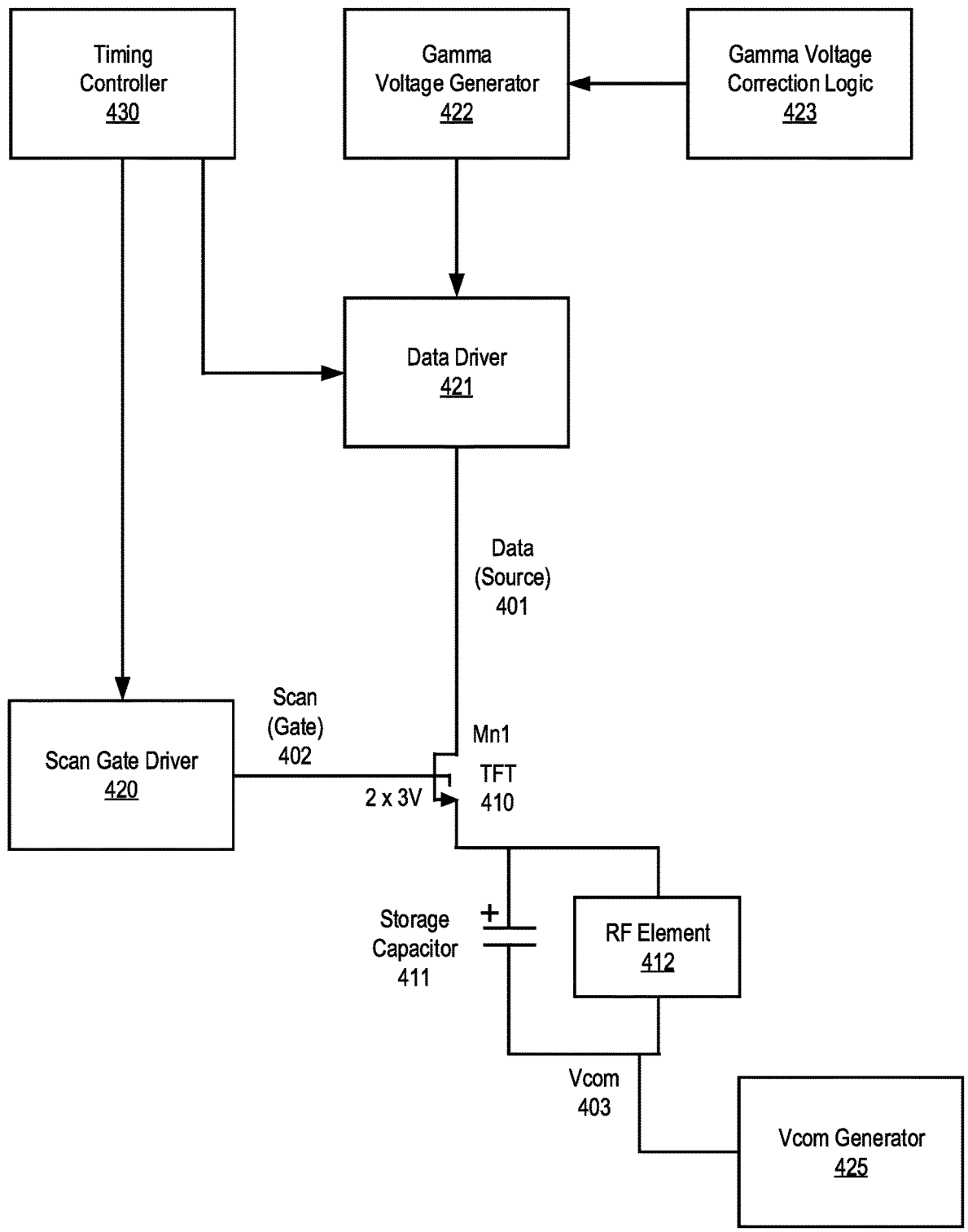
FIG. 4 illustrates driving voltages for an RF unit cell in an LC antenna aperture.

In one embodiment, the RF response of the antenna (transmission parameter S21) is observed in both frequency and time domain. Gamma voltage values are used for creating the "Data" voltages are employed to readjust the driving voltage. The gamma voltage controls the output "Data" voltage as shown in FIG. 4 for a typical "Data" driver chip. Referring to FIG. 4, the driving voltages for an RF unit cell in an LC antenna aperture include a reference, or common, voltage Vcom 402 that is coupled to the RF element 412 and storage capacitor 411. RF element 412 and storage capacitor 411 are also coupled to the drain of transistor 410. In one embodiment, transistor 410 is a thin film transistor (TFT). Gate 402 of transistor 410 receives a scan voltage from a scan/gate driver 420. Data/source 401 of transistor 410 is coupled to receive the output data voltage from a data driver 421, which is controlled by a gamma voltage from gamma voltage reference generator 422.

The gamma voltage driver "linearizes"/"corrects" the measured power vs voltage response for the desired frequencies for the segments. For each gray level/polarity, a new gamma voltage is calculated using the ΔVcom found for that gray level/polarity. These values are then placed into a look up table in memory (e.g., an EEPROM) on a controller board. In one embodiment, timing controller 430 is the controller board. These values are used to set up the gamma voltage generator 422. Gamma voltage generator 422 inputs into a resistor ladder in data driver 421, with the gamma voltages going to nodes on the resistor ladder. With this gamma chip info, and the gray level data from the controller board, data driver 421 writes the corrected source voltages to each source line as the "row" (gate) lines scan, thereby updating new information for each frame.

A timing controller 430 is coupled to control data driver 421 and scan/gate driver 420. In one embodiment, timing controller 430 controls the timing of the data voltage driving, as well as spitting data out to the data driver, which is using the gamma voltage generator to output the proper analog voltages to the source lines.

In one embodiment, the data driver chip output is defined at each gray shade level for both a negative and a positive frame. For N gamma voltage levels, there are N/2 gray shade levels directly controlled with gamma voltage. In one embodiment, RF ripple correction is performed at those N/2 gray shade levels.

In one embodiment, the RF ripple correction is performed by gamma voltage correction logic 423. In one embodiment, gamma voltage correction logic 423 comprises circuitry executing software. Alternatively, gamma voltage correction logic 423 comprises hardware, software, firmware or a combination of two or more of these. In one embodiment, the RF ripple is measured using a free space tester (FST), and gamma voltage correction logic 423 determines the ΔVcom using software being executed by circuitry (e.g., a processor, controller, digital logic, etc.), calculates the gamma voltage using the software and sends the new gamma voltage values to gamma voltage generator 422 using the software.

Figure 5:
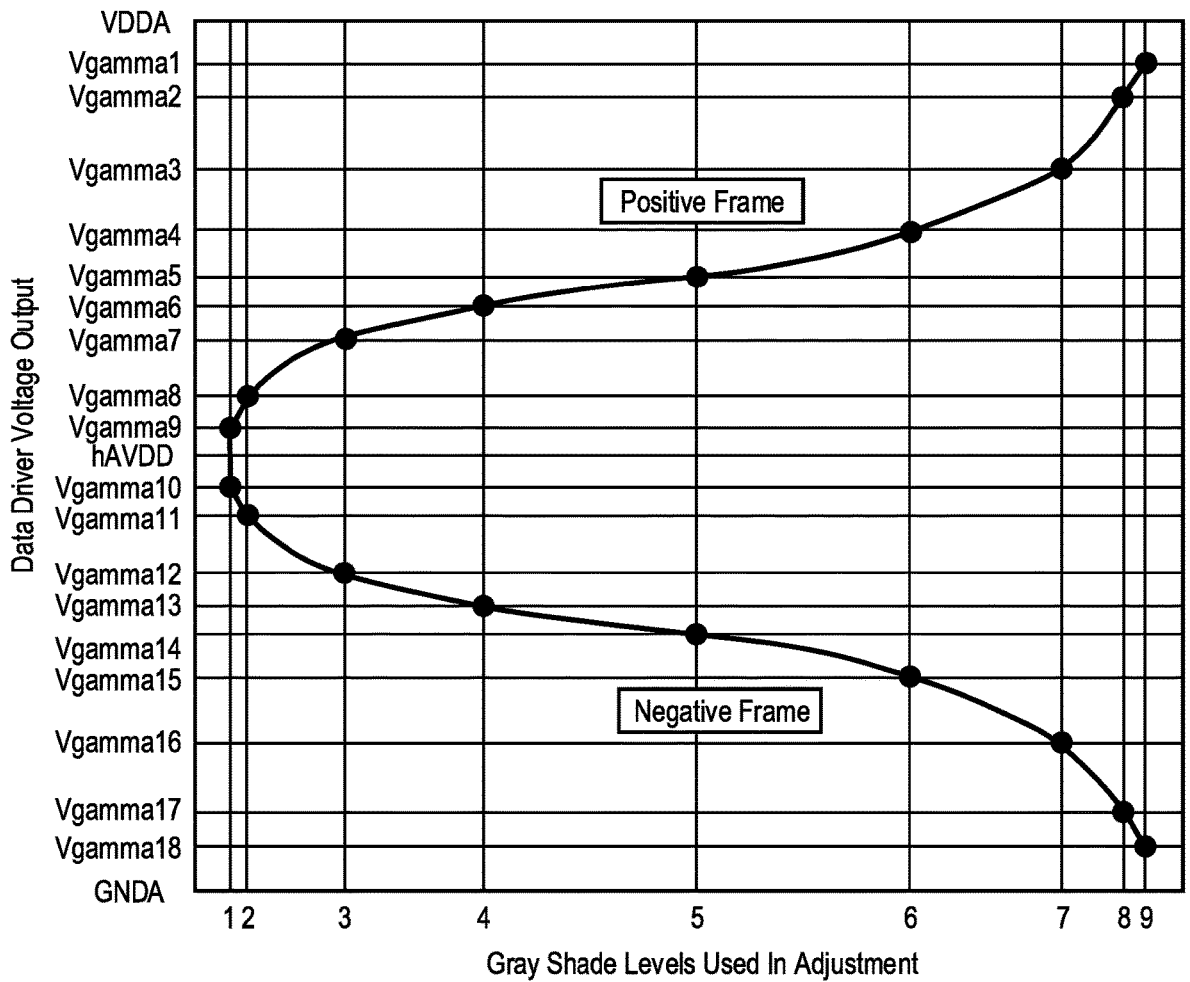
FIG. 5 illustrates data (source) driver output control using gamma voltages.

In one embodiment, an initial set of gamma voltages is determined. FIG. 5 illustrates an example of such gamma voltage curves. Referring to FIG. 5, the voltage curves are symmetric with respect to a voltage level in the middle, referred to as hAVDD. In one embodiment, that voltage level is also used as the initial value for the common voltage (Vcom). In one embodiment, the highest gray shade is set to achieve the largest voltage range possible and the lowest gray shade is set to achieve a 0V differential LC voltage.

When gray shade level is set to the largest voltage range, the RF response of the LC-based antenna element is observed in FST and the RF ripple is measured for the center frequency. If ripple amount is larger than the criteria, Vcom is increased or decreased until ripple amount is below the criteria. At that Vcom value, the center frequency is determined again in the frequency domain. The ripple measurement in the time domain is repeated at the new center frequency. If ripple amount is below the criteria, this Vcom value is established as the new Vcom value (Vcom_adj). Otherwise, the Vcom adjustment process is repeated until ripple amount is below the criteria.

The Vcom adjustment process is repeated for the remaining (N/2)−1 gray shade levels with a minor modification. For each of the remaining gray shades, the RF response and center frequency are measured. The ripple amount is measured in the time domain and Vcom is increased or decreased to match the ripple criteria. In one embodiment, the criterion is a threshold in which RF ripple above the threshold distorts the signal or otherwise affects the carrier to noise (C/N) at the receiver. In one embodiment, the threshold is set to 0.10 dB. Then RF response measurement is repeated to measure the new center frequency. The ripple is remeasured at the new center frequency. This process is repeated until the ripple amount satisfies the criteria. Vcom at this step is called Vcom_ temp.

$$\Delta Vcom = Vcom\_temp - Vcom\_adj$$

This difference (ΔVcom) is subtracted from the gamma voltage values for this gray shade level to calculate the new gamma voltage for this gray shade level. There are a number of ways to apply this adjustment. In one embodiment, ΔVcom is subtracted from both gamma voltage values, related to the positive and negative frames, used in that gray shade to calculate the new gamma voltage values for this gray shade level. In another embodiment, 2*ΔVcom is subtracted from one of the gamma voltage values in that gray shade.

In one embodiment, the Vcom level is set prior to the RF ripple correction and only temporary Vcom readjustment is allowed. Then, the gamma voltage adjustment described in the previous paragraph is also used for the highest gray shade level.

This adjustment process is repeated for the remaining gray shade levels to calculate ΔVcom and updated gamma voltage values. In one embodiment, the updated gamma voltage set is used with Vcom_adj as the new Vcom level to measure the ripple amount again at new center frequency for each gray shade level to confirm the ripple criteria. If the measured ripple amount satisfies the ripple criteria, the RF ripple correction process is considered as complete. Otherwise, the gamma voltage adjustment process is repeated until the RF ripple criteria are satisfied.

Figure 6:
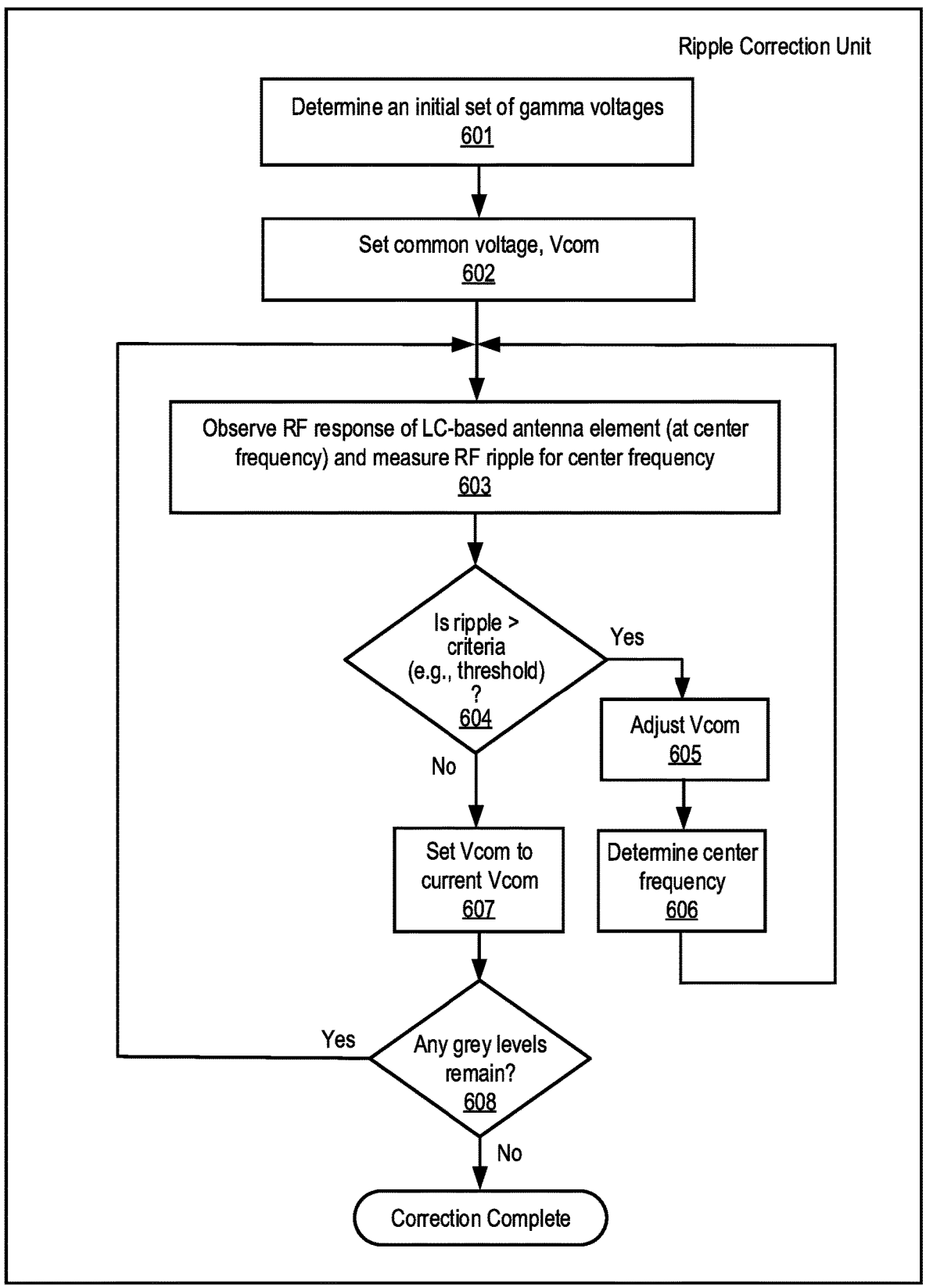
FIG. 6 is a flow diagram of an embodiment of a RF ripple correction process.

FIG. 6 illustrates one embodiment of a flow diagram of the above RF ripple correction process performed as part of one embodiment of an RF ripple correction unit. The process is performed by processing logic that may comprise hardware, software, firmware, or a combination of the three.

Figure 7A:
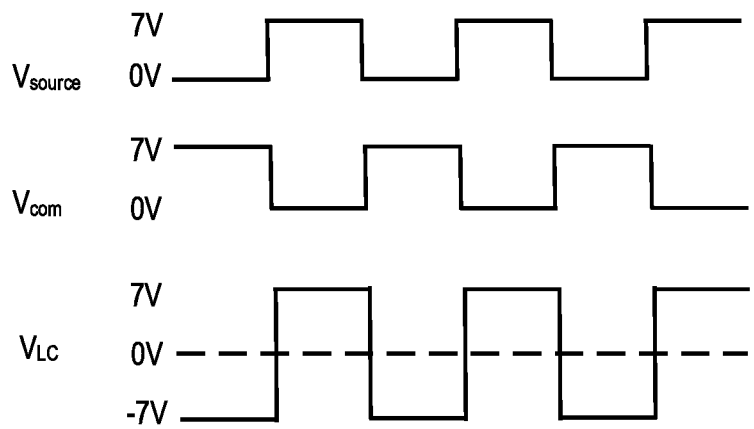
FIGS. 7A and 7D illustrate an example of voltage adjustments using one embodiment of the RF ripple correction process.

FIGS. 7A-7D illustrate one embodiment of a voltage adjustment process for a pseudo half Vdd drive mode for an antenna. Referring to FIG. 7A, the Vsource voltage is between 0V-7V along with the Vcom voltage. This is referred to herein as a 7V Half Vdd (True Half Vdd) driving mode. In such a case, the LC voltage (e.g., the voltage on the patch of a patch/slot antenna element) will be between 7V and −7V for the positive and negative frames. This represents the ideal case where the two voltages are symmetric about 0V.

Figure 7B:
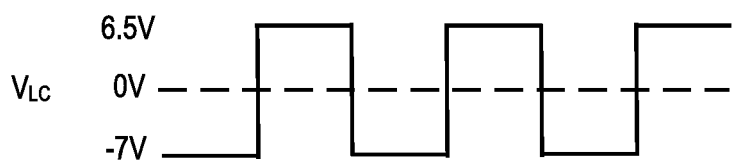
Figure 7C:
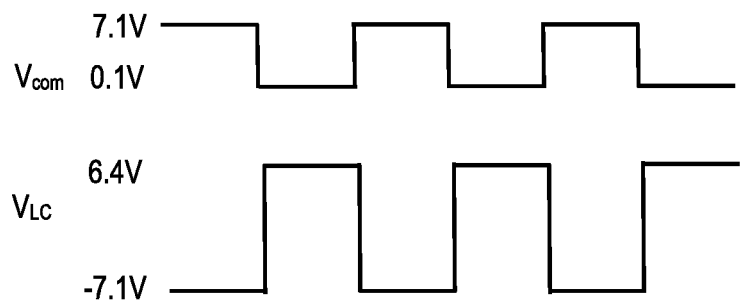
Figure 7D:
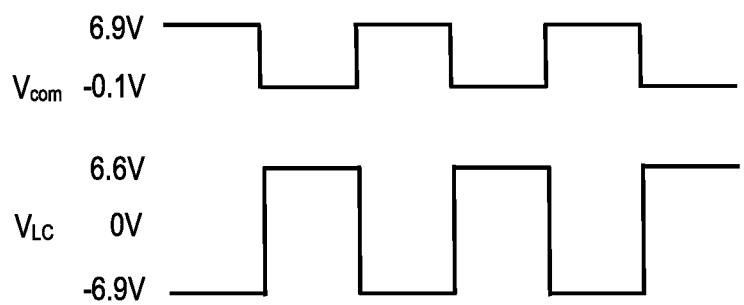

FIG. 7B illustrates the situation where two voltage levels are not symmetric about a voltage. Referring to FIG. 7B, the voltage on the source, Vsource, is between 0V and 6.5V and the range of the voltage is between 6.5V and −7V. This results in RF ripple. To address this, the RF correction unit increases the common voltage Vcom (as shown in FIG. 7C) or decreases Vcom (as shown in FIG. 7D). After increasing Vcom as shown in FIG. 7C, ripple is measured and if it is determined that RF ripple increases, the RF ripple correction unit determines that the voltage adjustment is going in the wrong direction moves to adjust Vcom by decreasing it. If the results of decreasing Vcom causes a reduction in ripple, then the RF ripple correction unit continues to decrease Vcom until RF ripple no longer decreases. Note that Vcom may be increased if the decreasing Vcom results in an increase in RF ripple.

In one embodiment, the step size used in adjusting Vcom may be the same throughout the RF ripple correction process. In another embodiment, the step size used in adjusting Vcom may change throughout the RF ripple correction process. For example, the step size may initially be uniform; however, as the amount of ripple has been decreasing (e.g., due to adjusting Vcom downward) and suddenly increases as a result of an adjustment in Vcom, the size of the adjustment may be made smaller in the opposite direction (e.g., an adjustment in Vcom upward) as the process of identifying a Vcom that results in no RF ripple or a predetermined amount of RF ripple (e.g., RF ripple being under a predetermined level) has been obtained.

A defined RF ripple correction process can be used for adjustment of gamma voltages on each segment of an antenna aperture (where the segments are coupled together to form a single aperture). In one embodiment, RF ripple correction process calculates an appropriate gamma voltage set using adjustment results on a small number of samples from each lot/batch of antenna elements being evaluated.

Note that one alternative antenna driving mode to the driving mode shown in FIGS. 7A-7D is referred to herein as 9V Half Vdd (Pseudo Half Vdd) driving mode. An important difference between 9V Half Vdd (Pseudo Half Vdd) and 7V Half Vdd (True Half Vdd) driving modes is that Vcom is switching between VcomH and VcomL in 9V mode and Vcom is a constant voltage in 7V mode.

Figure 8:
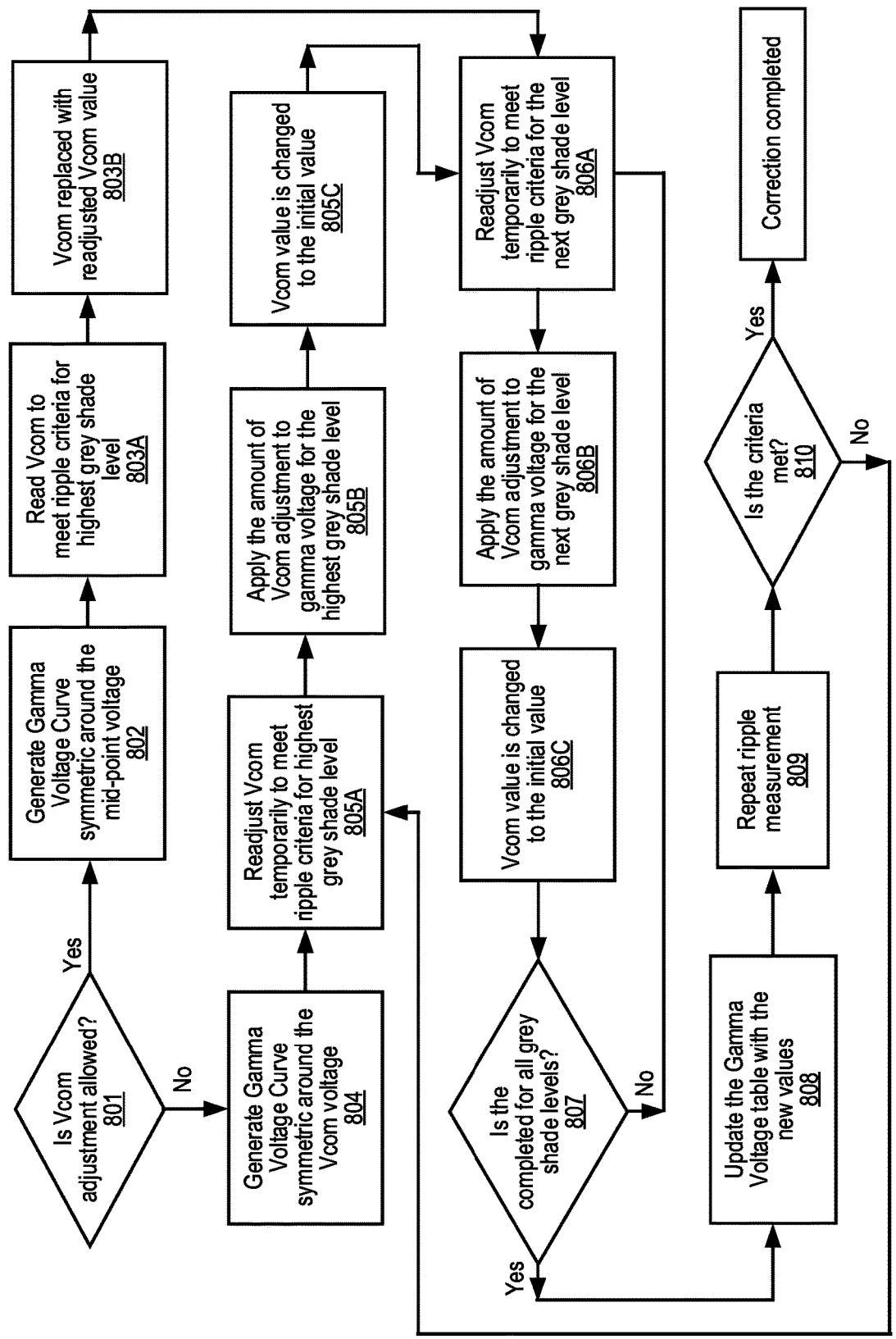
FIG. 8 is a flow diagram of another embodiment of a RF ripple correction process.

FIG. 8 is a flow diagram of another embodiment of a RF ripple correction process. The process is performed by processing logic that may comprise hardware, software, firmware, or a combination of the three. In one embodiment, operations set forth in FIG. 8 are performed by an RF ripple correction unit.

Referring to FIG. 8, the process begins by processing logic checking whether adjustment of Vcom is allowed (processing block 801). If it's allowed, then the process transitions to processing block 802. If not, the process transitions to processing block 804.

At processing block 802, processing logic generates initial gamma voltages for a symmetric voltage curve for positive and negative frames. The highest and lowest gamma voltage values are typically determined by driving chip specifications.

At processing block 802, processing logic also determines an initial Vcom value as the close as possible to generate 0V on the LC for the lowest gray shade level.

Thereafter, processing logic goes to highest gray shade level, corresponding to highest and lowest gamma voltages, and readjusts Vcom to meet ripple criteria (processing block 803A). In one embodiment, as part of processing block 803A, processing logic readjusts Vcom, checks the new center frequency (CF), checks the ripple at the new CF, readjusts Vcom, and if needed, repeats checking the center frequency and ripple.

After readjusting Vcom, processing logic replaces the initial Vcom value for the rest of the measurement with the adjusted Vcom (Vcom_adj) value. Thereafter, the process transitions to processing block 806A.

At processing block 804, processing logic generates the initial gamma voltages for a symmetric voltage curve for positive and negative frames around Vcom. As discussed above, in one embodiment, the highest and lowest gamma voltage values are typically determined by driving chip specifications. In one embodiment, processing logic sets gamma voltages in the middle of the highest and lowest gamma voltage values as close as possible to generate 0V on LC for the lowest gray shade level.

Next, processing logic goes to the highest gray shade level, measures ripple and readjusts Vcom (processing block 805B). In one embodiment, processing logic checks the new center frequency (CF) and checks the ripple at the new CF. In one embodiment, only a temporary Vcom change is allowed, and the nominal Vcom is referred to as Vcom_adj. In one embodiment, Vcom is temporarily readjusted to meet ripple criteria. That Vcom value is referred to as Vcom_temp.

After measuring ripple, processing readjusts Vcom again if the ripple doesn't meet the criteria and repeats checking and updating Vcom_temp. If ripple criteria are met, processing logic calculates $$\Delta Vcom = Vcom\_temp - Vcom\_adj$$

In one embodiment, processing logic calculates new gamma voltages by using:

$$gamma\_positive\_new = gamma\_positive - 2*\Delta Vcom$$

Then processing logic goes to the next gray shade level, measures ripple with Vcom_adj and readjusts Vcom (processing block 806B). In one embodiment, processing logic checks the new center frequency (CF) and checks the ripple at the new CF. Temporarily readjust Vcom to meet the ripple criteria. This Vcom value is referred to herein as Vcom_temp. The Vcom is again readjusted if the ripple doesn't meet the criteria, and processing logic repeats checking and updates Vcom_temp.

If ripple criteria are met, processing logic calculates $$\Delta Vcom = Vcom\_temp - Vcom\_adj$$

In one embodiment, processing logic calculates new gamma voltages by using one of the following:

$$gamma\_positive\_new = gamma\_positive - \Delta Vcom, \text{ and}$$

$$gamma\_negative\_new = gamma\_negative - \Delta Vcom$$

Note that in one embodiment, the difference is applied only on one side:

$$gamma\_(positive\ or\ negative)\_new = gamma\_(positive\ or\ negative) - 2*\Delta Vcom$$

After handling the current gray shade level, processing logic changes the Vcom value back to its initial value (processing block 806C) and the process transitions to processing block 807.

The steps above from FIG. 8 are for the gamma voltage correction in a true half Vdd mode where Vcom is not switching. For a different drive mode, pseudo half Vdd, where Vcom is switching between Vcom High and Vcom Low levels as seen in FIGS. 7A-7D, the process of FIG. 8 can be modified so that RF ripple correction is performed by changing Vcom High and Vcom Low levels until the RF ripple is below the threshold. In that case, in one embodiment, new gamma voltages are calculated according to the following:

$$gamma\_positive\_new = gamma\_positive - (Vcom\_low\_temp - Vcom\_low\_adj)$$

$$gamma\_negative\_new = gamma\_negative - (Vcom\_high\_temp - Vcom\_high\_adj)$$

Vcom_high_adj and Vcom_low_adj, similar to Vcom_adj, are Vcom High/Low levels obtained in the adjustment step. Vcom_high_temp and Vcom_low_temp, similar to Vcom_temp, are temporary Vcom High/Low levels used in RF ripple correction step. In the other case, process described in FIG. 8 can be applied without any change if the same amount of Vcom change is applied to both Vcom High and Vcom Low level.

At processing block 807, processing logic checks whether all gray shade levels have been completed. If not, the process transitions to processing block 806A and the process continues there for the remaining gray shade levels. If all the gray shade levels have been completed, processing transitions to processing block 808.

After all remaining gray shade level have been evaluated, and corrected if necessary, processing logic updates a gamma voltage table that contains the gamma voltages for the gray shade levels with new values (processing block 808).

In one embodiment, processing logic repeats the RF ripple measurement (processing block 809) and check whether the RF ripple criteria is met (processing block 810). If it isn't met, then repeat, then the process transitions to processing block 805A for gray shade levels not meeting the criteria, and the process repeats from there until the criteria is met for all gray shade levels. If the criteria are met (processing block 810), then the process ends.

Overview of DC Offset Correction

Embodiments of the invention include a technique to correct for direct current (DC) offsets in an RF antenna aperture. There are many factors that can contribute to a net DC offset in an antenna. The charging ratios, kickback voltages, and charge leakages are typically not equal between positive and negative frames, and additionally, these values may change with gray level.

There are several difficulties in applying display methods for handling a DC offset to an RF TFT aperture. For example, one difficulty is that there are optically opaque metal layers that prevent observation of the LC in the critical areas of the elements.

Embodiments of the invention include structures and methods for optically observing flicker in selected places in the RF TFT aperture, to enable using a correction technique to reduce the DC offset in RF TFT apertures. Embodiments of the invention take advantage of the fact that, besides having an anisotropy in permittivity to RF radiation, the liquid crystals used to build RF TFT apertures also have an optical anisotropy measured by the difference between the index of refraction of the fast (short) and slow (long) axis of the LC molecules.

Typically, the delta n of LC used for RF TFT aperture purposes is larger than the delta n of an LC whose properties have been optimized for a display. Between crossed polarizers with rubbing direction at 45 degrees to the polarizers, at an LC gap of 2.7 um, the electro-optic curve of an RF optimized LC will show several maxima and minima from 0 to 7.5 Vrms.

Figure 9:
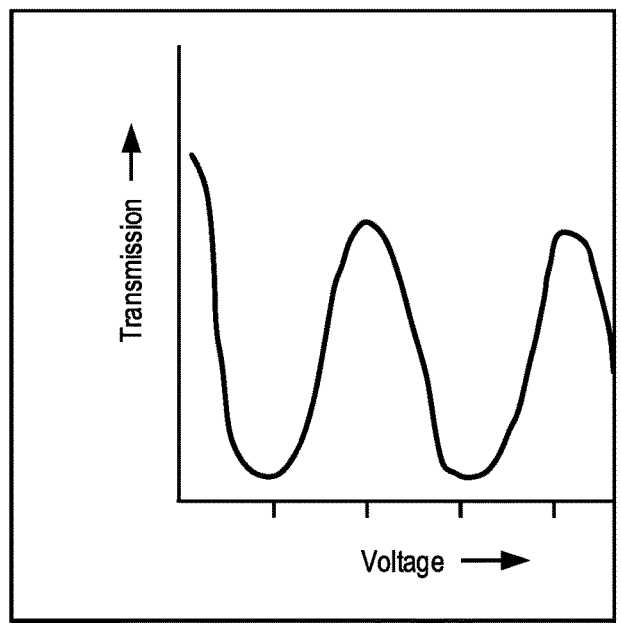
FIG. 9 illustrates an example of a transmission versus voltage curve.

FIG. 9 illustrates an example of a transmission versus voltage curve. Referring to FIG. 9, as a consequence of the LC being optimized for –RF antenna use, the optical delta n of this LC is much larger than in an LC optimized for an LCD. For an electrically controlled birefringence (ECB) cell with the proper choice of polarizers and rubbing direction, the transmission versus voltage curve would look something like the plot in FIG. 9.

An optical transmission difference between the positive and negative frames are accentuated in parts of the optical transmission curve where the change in transmission with voltage is rapid (steep slope). Those regions should be used for determining correction voltages for gray levels.

For given positive and negative frames of an RF TFT aperture gray level, there will be corresponding optical states for the positive and negative frames on the electro-optic curve. These corresponding optical states on the electro-optic curve will be different due to the DC offset. This difference between optical transmission values will be observed as a "flicker". In one embodiment, these optical states for the positive and negative frames on the electro-optic curve are used to correct the DC offset. The DC offset correction techniques disclosed herein generate a DC offset correction voltage that can be determined by nulling the "flicker".

In one embodiment, the net DC offset is adjusted by adjusting the Vcom voltage. This may be for different driving modes. For example, in one embodiment, at a gross level, for a ½ VDD mode of driving (in which the voltage range between the positive and negative frames is ½ VDD), the net DC offset is adjusted by adjusting the Vcom voltage. In one embodiment, the DC offset correction is performed by DC offset correction logic. In one embodiment, such logic comprises circuitry executing software and is coupled to circuitry such as shown in FIG. 4 to adjust the Vcom voltage. Alternatively, DC offset correction logic comprises hardware, software, firmware or a combination of two or more of these.

In one embodiment of a process, it is desirable to reduce the frame rate (lengthen the frame time) to increase the time the LC has to respond to the voltages of the positive and negative frames. This is because LC has a response time and one needs to wait for that response time to observe the optical response to voltage change. If the frame time isn't long enough to observe the LC response, the frame time used during DC offset calibration can be increased. However, the frame rate cannot be simply lengthened because the length of the frame time may affect key components of the DC offset, such as, for example, the charging ratio and voltage leakage. In one embodiment, increasing the time the LC has to respond to the voltages of the positive and negative frames is accomplished by a drive mode where the frame times are kept at the same length, but multiple frames of positive voltage are written in a row, followed by an equal number of negative frames, and so on, until the null measurement is completed. In one embodiment, the DC offset calibration is performed with that increased frame time but the initial frame time is still used for the antenna operation.

Figure 10:
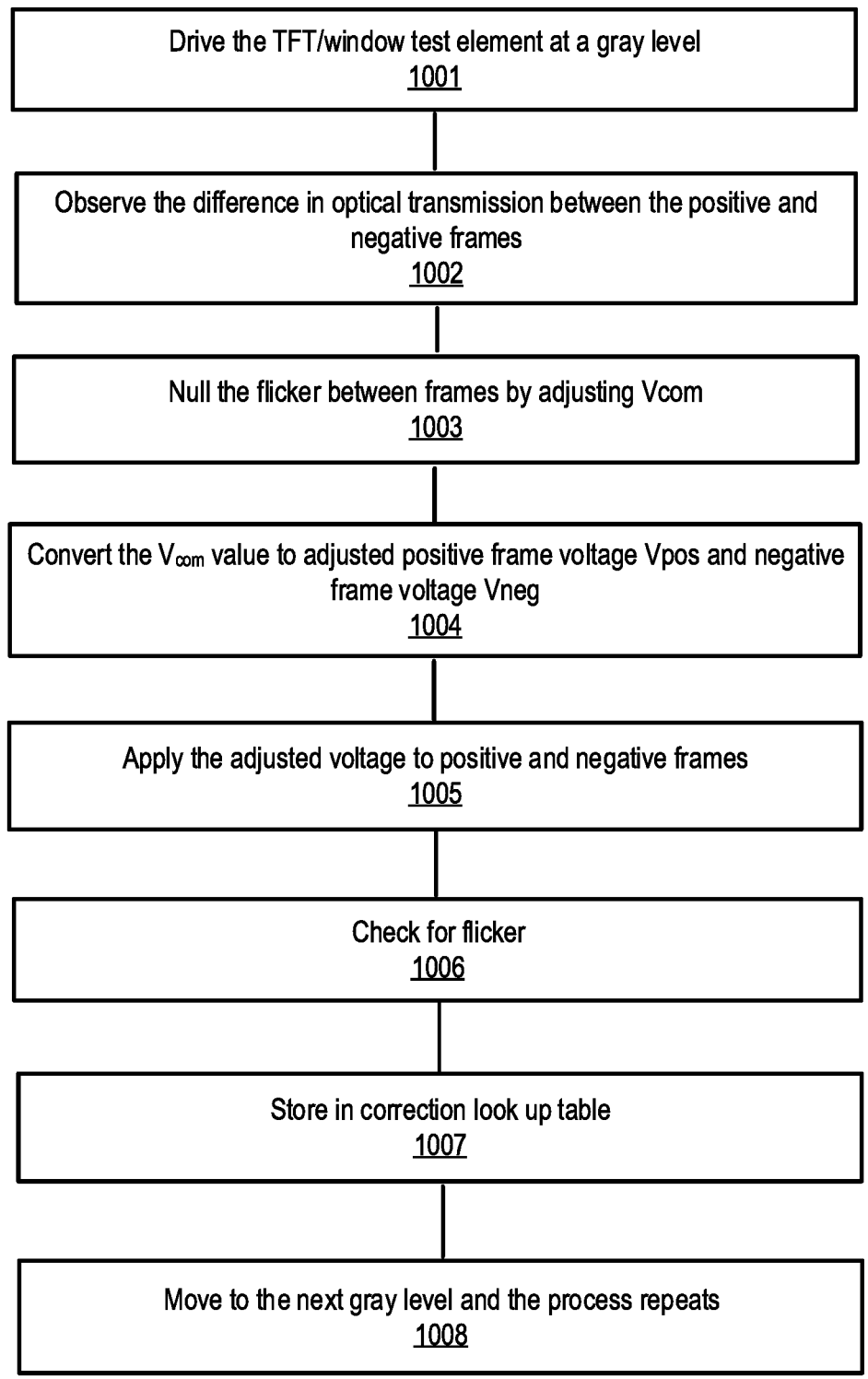
FIG. 10 is a flow diagram of a one embodiment of a process to determine DC offset correction values.

FIG. 10 is a flow diagram of a one embodiment of a process to determine DC offset correction values. The process is performed by processing logic that may comprise hardware, software, firmware, or a combination of the three. In one embodiment, operations set forth in FIG. 8 are performed by DC offset correction logic or a DC offset correction unit. In one embodiment, the DC offset correction unit or logic is in a testing and calibration equipment used in the production line of an antenna.

The process of FIG. 10 relies on observations related to the difference in optical transmission between the positive and negative frames. In one embodiment, the optical transmission in the positive and negative frames is captured using optical structures. In one embodiment, these optical structures are also used to test functionality of matrix row and column drivers for RF radiating antenna elements (e.g., surface scattering metamaterial antenna elements, such as, for example, described below).

Referring to FIG. 10, the process for obtaining correction values begins by processing logic driving the TFT/window test element at a gray level (processing block 1001) and observing the difference in optical transmission between the positive and negative frames (processing block 1002).

Processing logic then nulls the flicker between frames by adjusting Vcom (processing block 1003).

After adjusting Vcom to a level that nulls the flicker, processing logic converts the Vcom value to adjusted positive frame voltage Vpos and negative frame voltage Vneg (processing block 1004).

Then processing logic applies the adjusted voltage to positive and negative frames (processing block 1005) and checks for flicker (processing block 1006).

If there is no flicker, processing logic stores adjusted positive and negative frame voltages in correction look up table (processing block 1007).

If flicker still occurs, in one embodiment, the process transitions back to processing block 1003 and the process repeats.

After flicker has been nulled for the gray level, processing logic moves to the next gray level and the process repeats (processing block 1008).

In one embodiment, within each of the gray levels, the process is performed to null flicker for one element and after the process is completed for that element, the process moves to the next element and repeats until all the elements are tested.

In one embodiment, the corrections determined for RF TFT elements that were measured are used to determine corrections of unmeasured RF TFT elements. In one embodiment, the DC offset correction unit interpolates the corrections for measured TFT/window test elements to unmeasured RF TFT elements. These unmeasured RF TFT elements may be located between the tested RF TFT elements and/or near the tested RF TFT elements.

Optically Transparent Test Structures to Correct DC Offset

In one embodiment, optically transparent test structures are used to observe flicker and determine the DC offset to null the flicker. In one embodiment, these structures are located outside of the RF TFT element array and contain equivalent circuits the same or very similar as those found in the RF TFT aperture array in the aperture segment. Antenna segments are combined to form the entire antenna array. For more information on antenna segments, see U.S. Pat. No. 9,887,455, entitled "Aperture Segmentation of a Cylindrical Feed Antenna". In one embodiment, the optical characteristics of such structures are used to estimate and create correction values to reduce the DC offset in RF element array.

Figure 11:
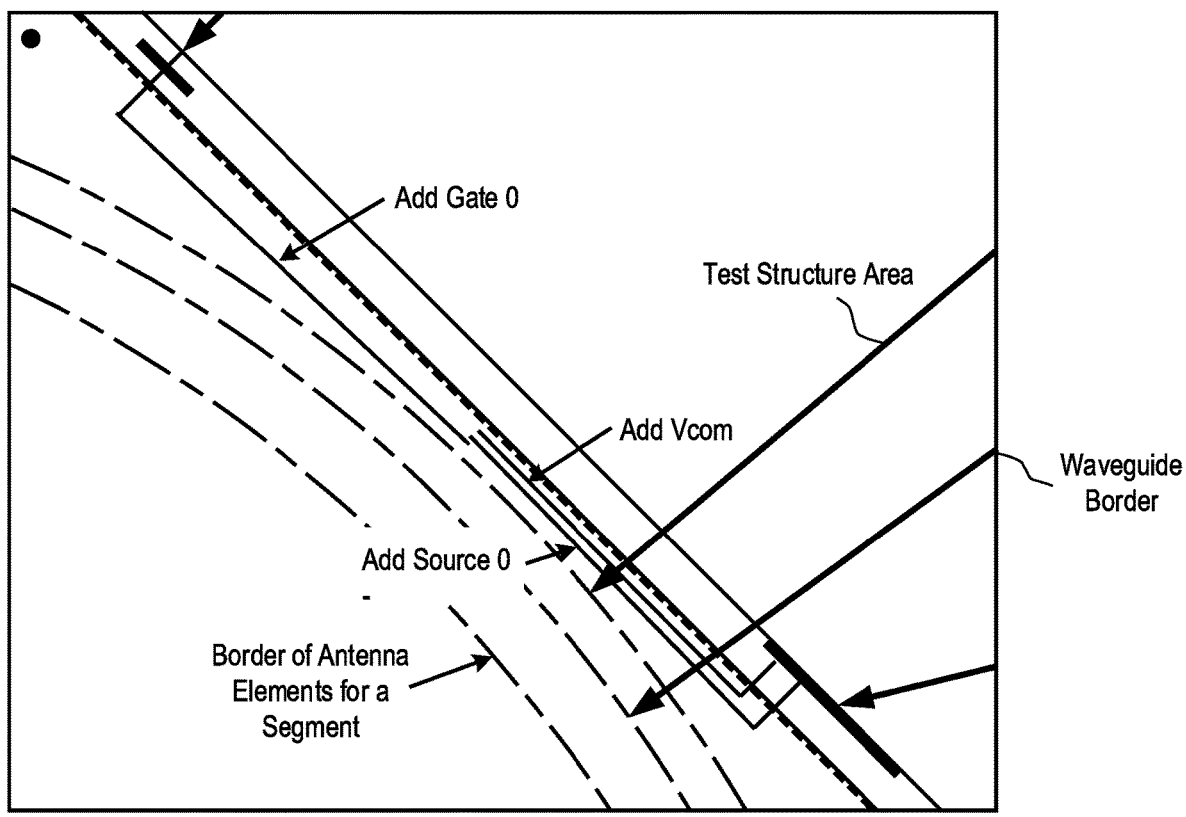
FIG. 11 illustrates one embodiment of routing for a single test structure located outside of the waveguide area.
Figure 23:
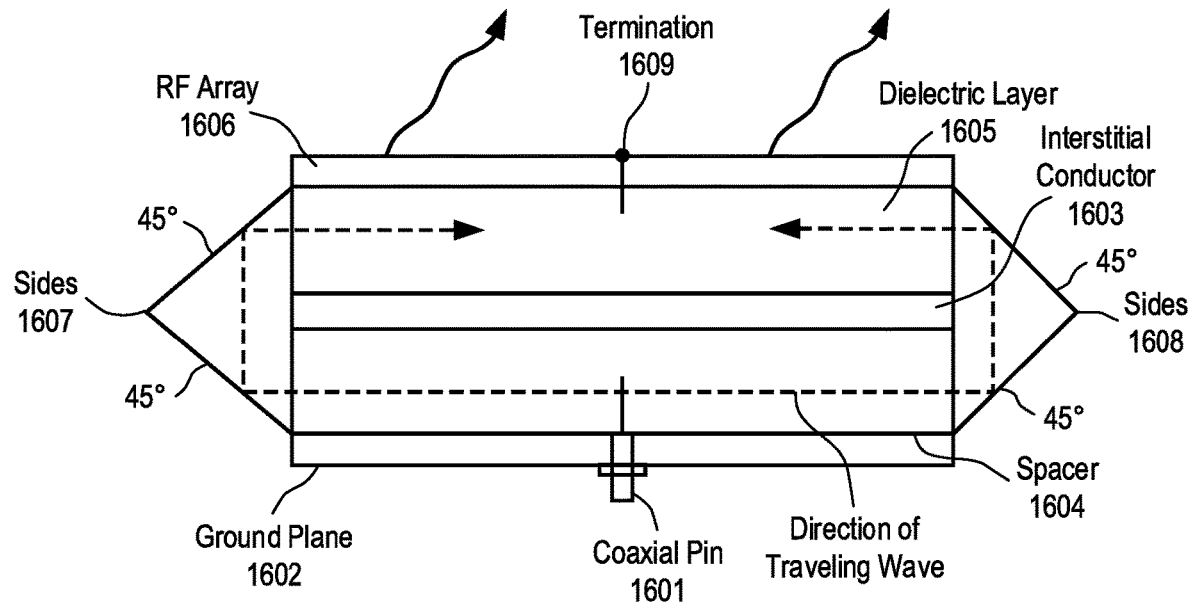
FIG. 23 illustrates a side view of one embodiment of a cylindrically fed antenna structure.

In one embodiment, the Gate 0 and Source 0 lines associated with voltages for the test structure are added outside of the waveguide region (e.g., a waveguide of FIG. 23 of the aperture where additional holes in the waveguide do not impact performance. FIG. 11 illustrates one embodiment of routing for a single test structure located outside of the waveguide area. Referring to FIG. 11, Gate 0, Source 0 and Vcom routing for voltages for the test structure are shown outside of the area the waveguide.

Figure 12:
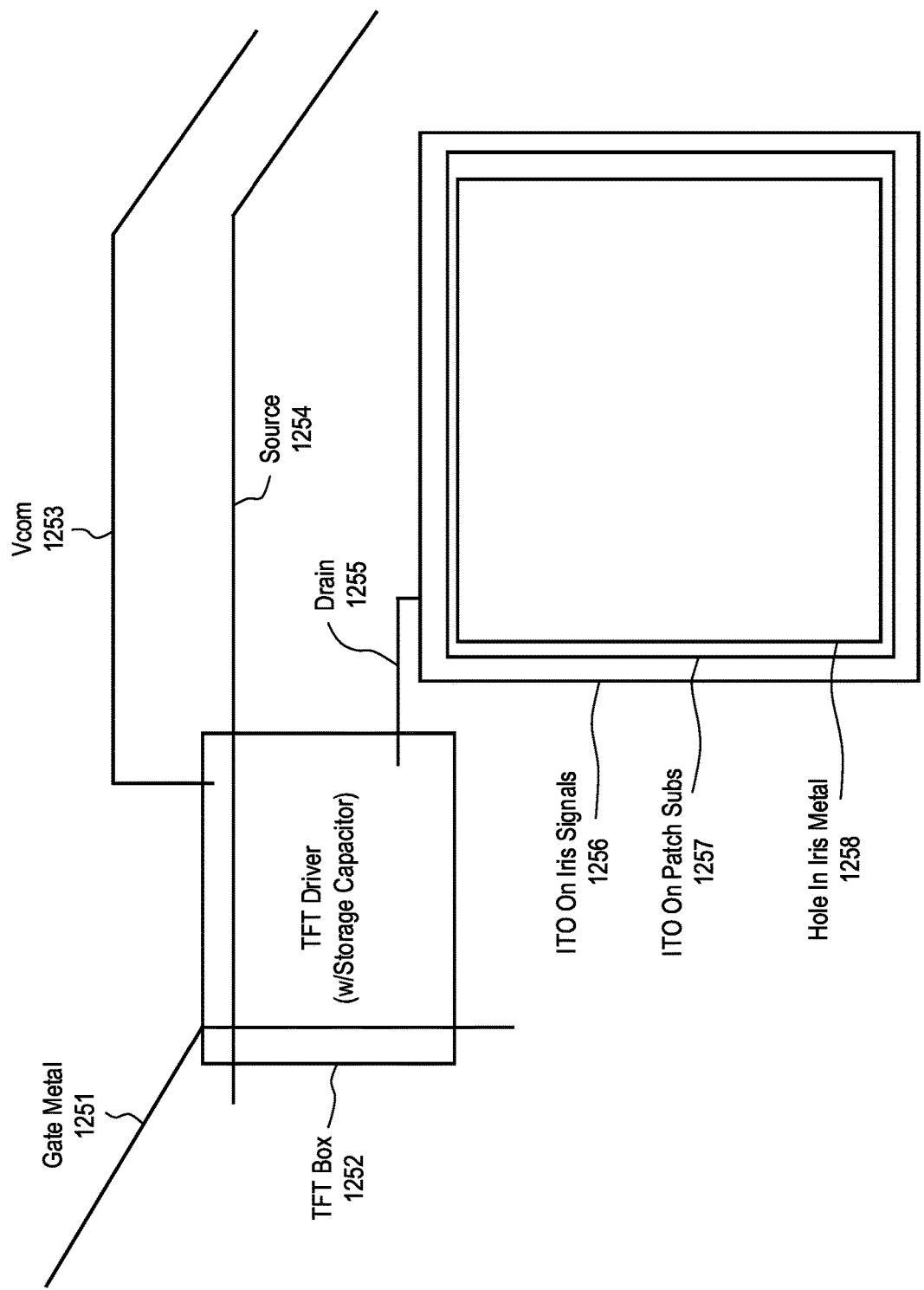
FIG. 12 illustrates one embodiment of a test structure.

FIG. 12 illustrates one embodiment of a test structure. In one embodiment, the equivalent circuit of the test structure is designed to have the equivalent circuit of an RF element in the array. In particular, the capacitance of the device at the drain is sized to match the capacitance of the overlap of a patch element with the iris element. In one embodiment, an optically transparent conductor layer, such as, but not limited to, indium-tin-oxide (ITO), is used as an electrode on both sides of that capacitor. Observation windows are created in metal layers for optical response of the LC.

Referring to FIG. 12, TFT box 1252 includes a TFT and storage cap, such as, for example, but not limited to, FIG. 4. Gate metal 1251 is for the gate voltage of the TFT, source 1254 is for the source voltage of the TFT and drain 1255 is for the drain voltage of the TFT that is coupled to a test antenna element (e.g., a surface scattering metamaterial antenna element). In one embodiment, the gate and source are coupled to Gate 0 and Source 0 of FIG. 11. The routing 1253 for Vcom is also shown coupled to the TFT 1252.

As shown, a hole 1258 in the iris metal is used as a window to view flicker using ITO 1256 on the iris (slot) substrate and ITO 1257 on the patch substrate, such as the patch and iris substrates described in more detail below.

As discussed above, Gate 0 and Source 0 lines for the test structure are also added outside the waveguide region of the aperture. In this embodiment, Gate 0 lines cross all of the source lines as the source lines cross from the source driver outside of the aperture segment to the inside of the segment (e.g., inside being the inside the border seal where the LC resides.)

Figure 13:
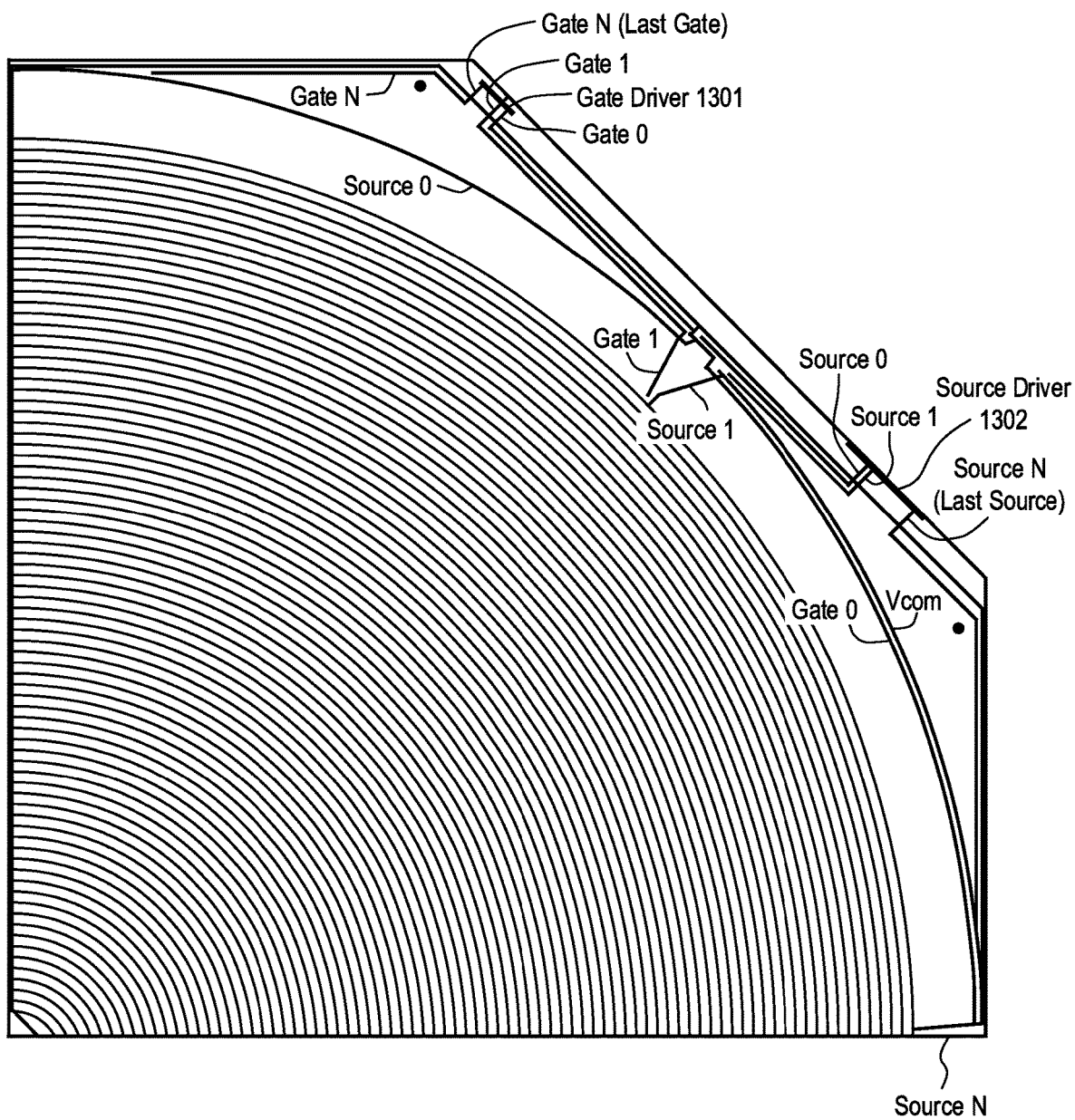
FIG. 13 illustrates one example of gate and source line routing for optically transparent test structures.

In another embodiment, the Gate 0 can be extended to cross all of the Source lines, and the Source 0 can be extended to cross all of the Gate lines. Optically transparent test structures can be created where Gate 0 crosses the source lines and Source 0 crosses the gate lines FIG. 13 illustrates one example of gate and source line routing for optically transparent test structures. In one embodiment, the routing is moved as far as possible outside of the waveguide region and spaces created in the fan out for TFT/window test elements. In one embodiment, a TFT/window test structure similar to the one shown in FIG. 12 is placed at each source/Gate 0 junction, where the source could be Source 0, Source 1, ... Source N (source of the last test transistor).

Referring to FIG. 13, gate driver 1301 provides the gate voltages for Gates 0-N and source driver 1302 provides the source voltage for Sources 0-N, where N designates the last of the gates and sources, respectively. In one embodiment, gate driver 1301 and source driver 1302 are at the edge of the antenna aperture segment.

Figure 14:
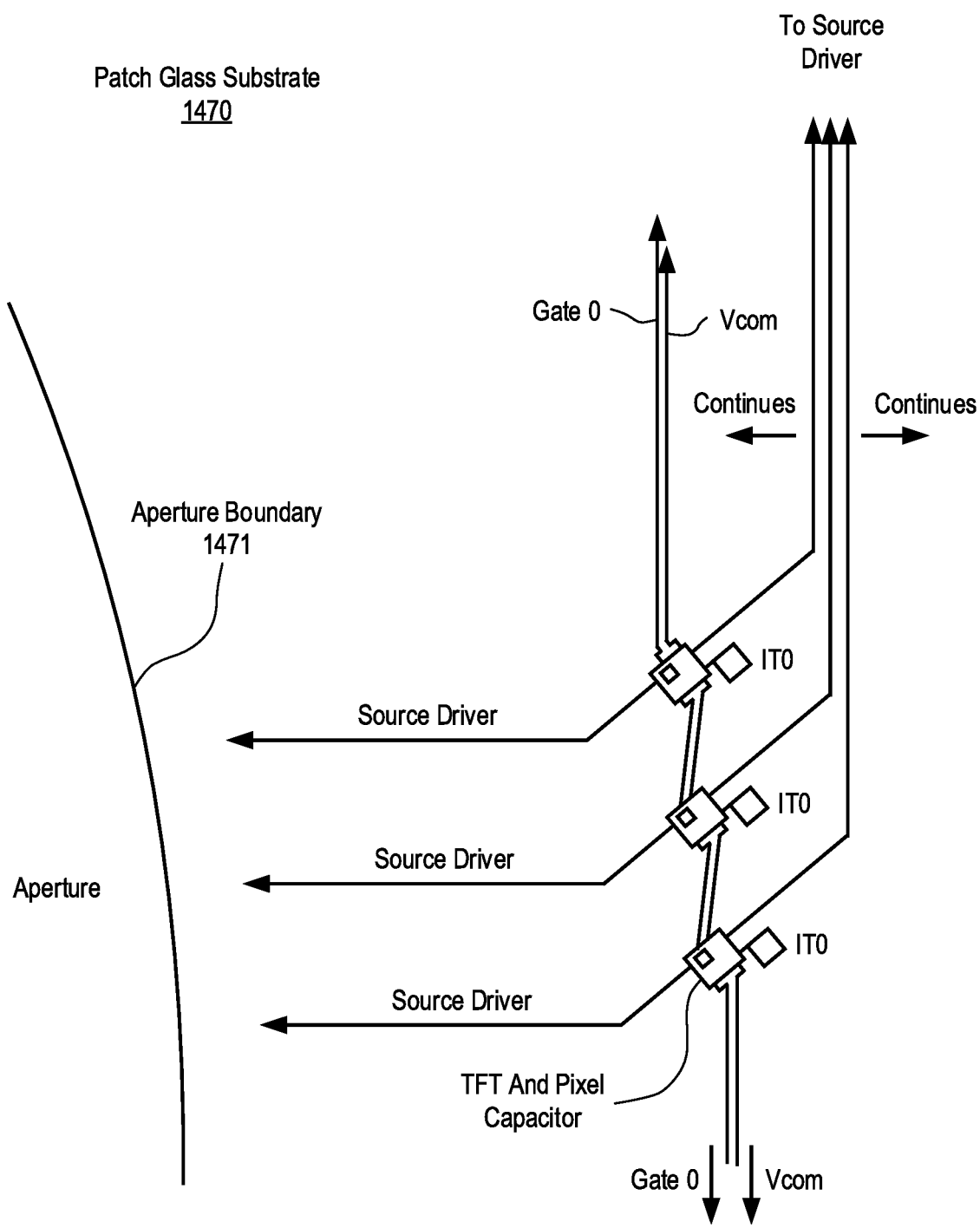
FIGS. 14 and 15 illustrate examples of patch glass (substrate) and iris glass (substrate) structures, respectively, that form the patch and iris for the antenna aperture.
Figure 15:
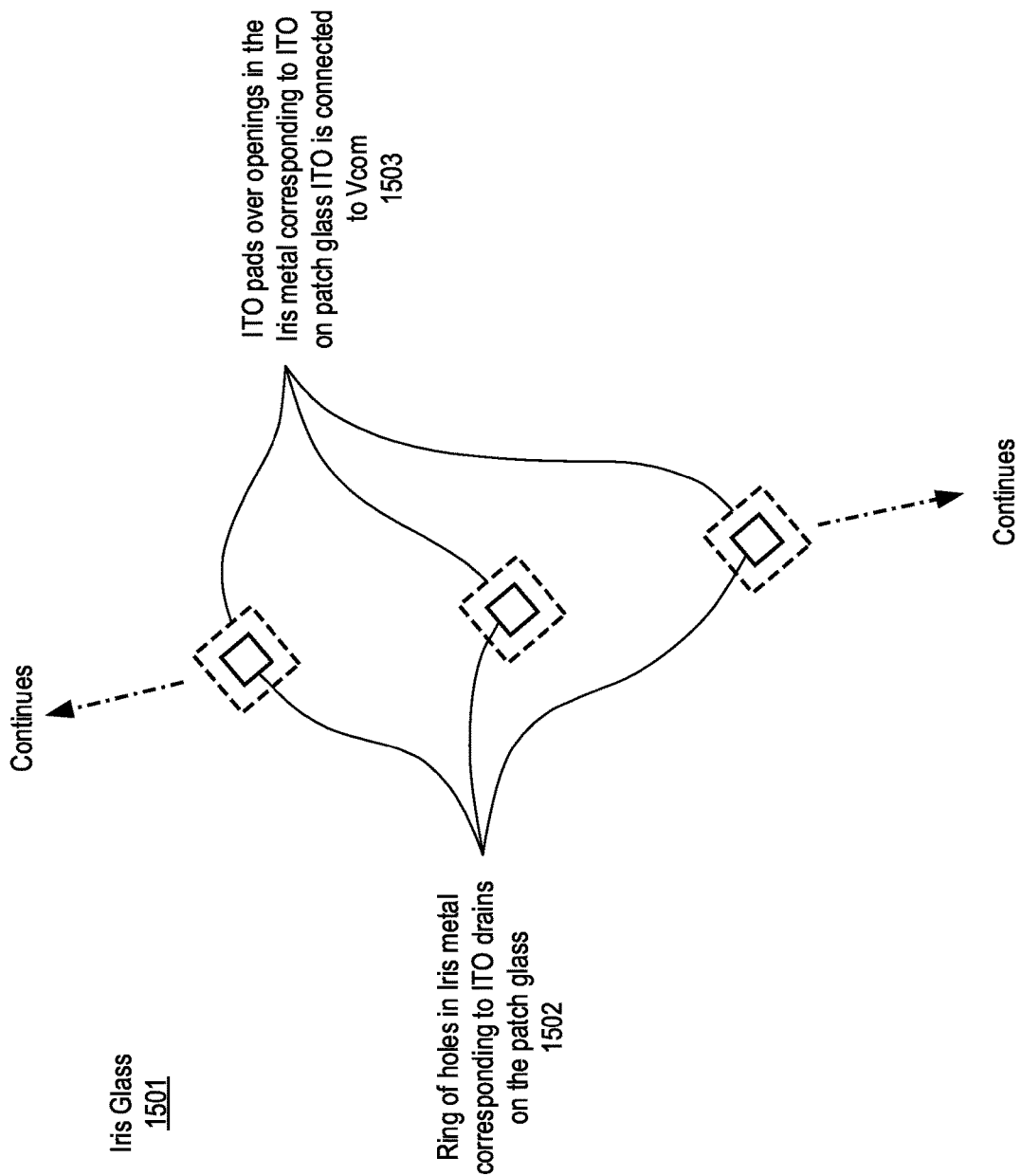

FIGS. 14 and 15 illustrate examples of patch glass (substrate) and iris glass (substrate) structures, respectively, that form the patch and iris for the antenna aperture. An example of the glass and iris substrates are described in greater detail below.

Referring to FIG. 14, patch glass substrate 1470 for an antenna aperture segment includes antenna element aperture boundary 1471 that represents the boundary of the antenna element array (with antenna elements to the left of boundary 1471). On the right of boundary 1471 are optically transparent test structures (e.g., ITO holes, or windows) with associated TFTs (and storage capacitor) and the source, gate, and Vcom routing for those structures.

Referring to FIG. 15, illustrates iris glass substrate 1501 with a ring of holes 1502 in the iris metal layer corresponding to the ITO drains on the patch glass substrate. ITO pads 1503 over openings in the iris metal layer correspond to the ITO on the patch glass substrate ITO is connected to Vcom.

In one embodiment, the DC offset in the RF element waveform is optically nulled in these structures and the resulting "null" values are used to set Vcom and correct the DC offset in RF elements in the array.

In addition to being used to correct the aperture drive for DC offset, in one embodiment, these structures are also used to test the functionality of the source and gate drivers at the beginning of the array via an optical mechanism.

Likewise, in one embodiment, a Source 0 is routed to cross the gate lines as they enter the segment.

Figure 16:
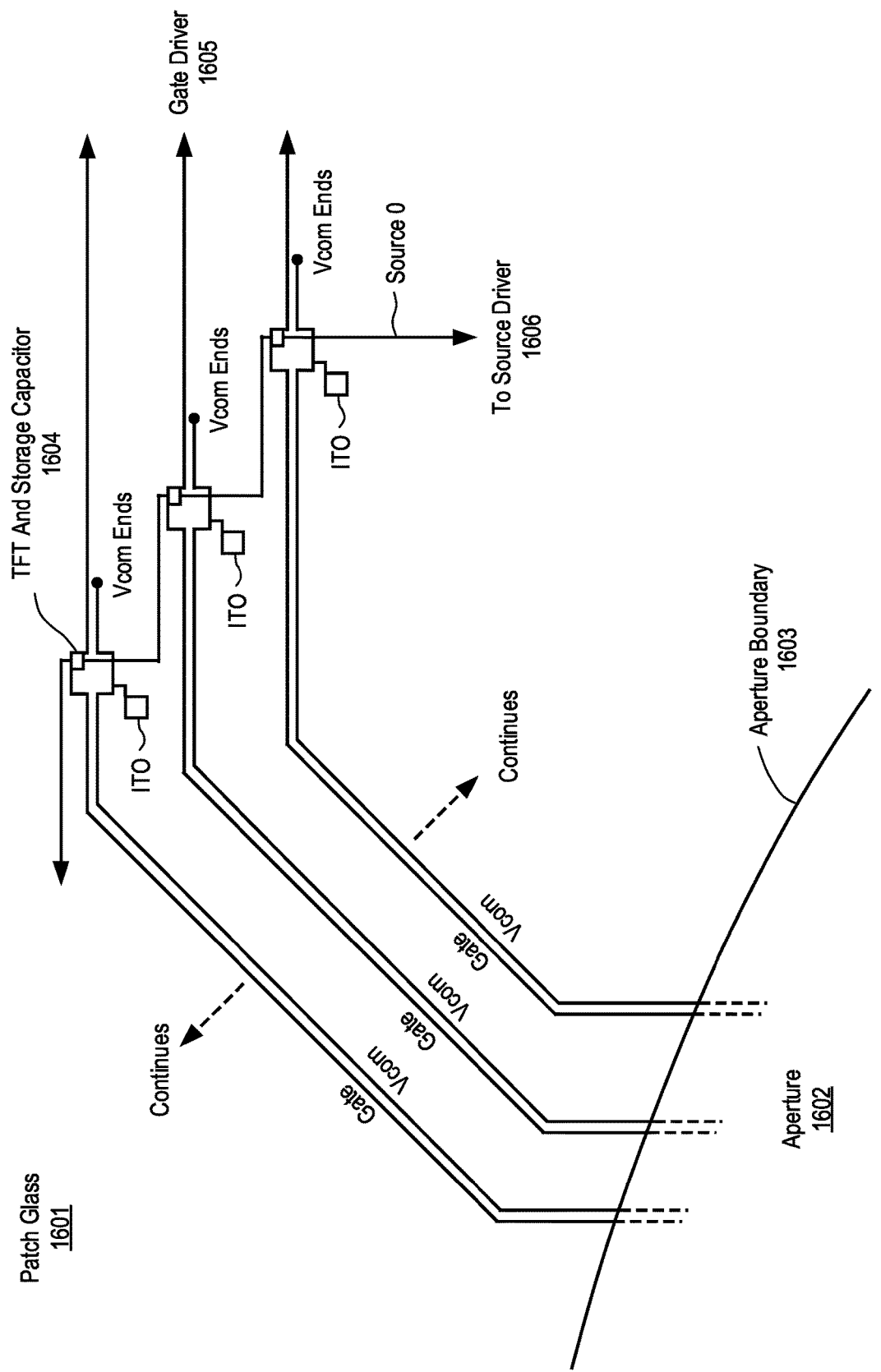
FIGS. 16 and 17 illustrate examples of routing on the patch glass substrate and iris glass substrate, respectively.
Figure 17:
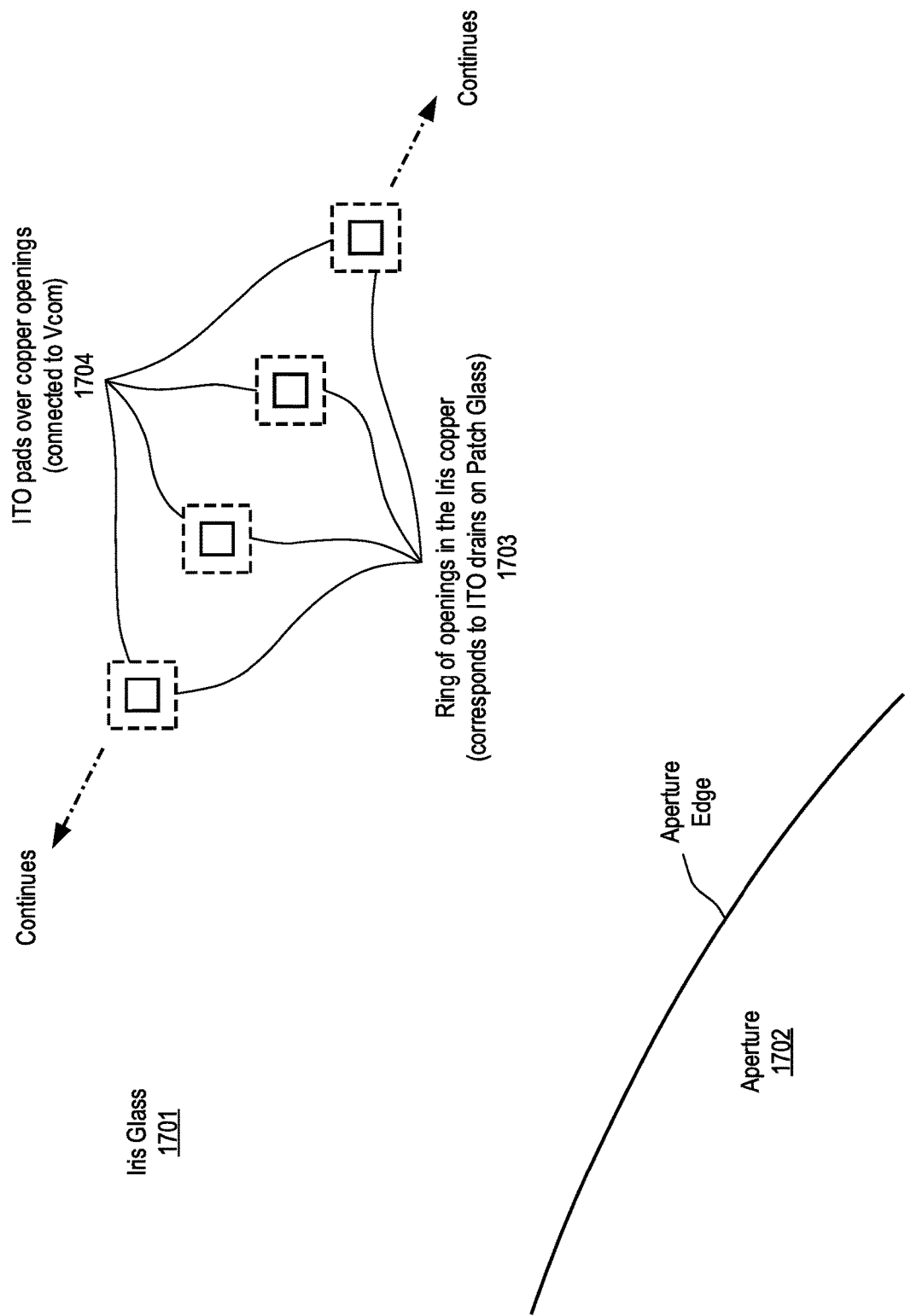

In one embodiment, the gate routing is moved and spaces are created to place a TFT/window test element at each Gate/Source 0 junction. FIGS. 16 and 17 illustrate examples of this routing on the patch glass substrate and iris glass substrate, respectively.

Referring to FIG. 16, patch glass substrate 1601 includes an antenna element aperture 1602 with an antenna aperture boundary 1603. Test structures 1604 with their TFT (with storage capacitor) and their ITO hole (window) are coupled to gate driver 1605 and source driver 1606. Gate and Vcom routing continue from test structures 1604 into antenna element aperture 1602.

Referring to FIG. 17, iris glass substrate 1701 is shown with a ring of windows (openings) 1703 in the iris metal layer (corresponding to ITO drains on the patch glass substrate) with ITO pads 1704 over the iris metal openings. Pads 1704 are connected to Vcom.

In one embodiment, the DC offset in the RF element waveform is optically nulled in these structures and the resulting "null" values used to set Vcom and correct the DC offset in RF elements in the array.

Besides being used to correct the aperture drive for DC offset, in one embodiment, these structures are also used to test the functionality of the source and gate drivers at the beginning of the array by an optical mechanism.

Note that the optically transparent test structures are not limited to being outside the antenna element array. In one embodiment, the TFT/optical window test element replaces some RF TFT elements in the antenna array. Due to the holographic nature of forming a beam, an aperture with some small number of elements missing can form beams with a negligible decrease in performance compared to antennas with fully functioning RF element arrays. In one embodiment, RF elements in certain locations are replaced with TFT/window test elements. In another embodiment, the voltage values used to optically null these the TFT/window test elements are used to create a mapping of corrections, which is used to interpolate correction values for the RF element array. In one embodiment, this mapping is stored in a look up table.

In another embodiment, these TFT/window test elements are not placed in the RF element array according to their geometric position, but are placed according to their position as an equivalent circuit of the array. In one embodiment, the "first" and "last" elements, for example, in frame inversion, the first scanned and last scanned, will not have the same bias over the TFT for the same lengths of time. The RC time constant to the TFT is not the same, etc. Some places may be more highly contaminated (fill opening). Therefore, the DC offset may be different in these places. In this case, the placement location is the location from an electronic point of view and not a geometric point of view. This might mean an element of the first source and first gate line, an element of the first source and the last gate lines, an element of the last source and first gate, an element of the last source and last gate, etc.

Furthermore, while the above testing for flicker is described in terms of a transmission LC mode, the techniques described herein are not limited to such a mode. In another embodiment, the LC optical response is observed using a reflective LC mode instead of a transmissive LC mode.

Examples of Antenna Embodiments

The RF ripple correction, DC offset correction and voltage adjustment techniques described above may be used in a number of antenna embodiments, including, but not limited to, flat panel antennas. Embodiments of such flat panel antennas are disclosed. The flat panel antennas include one or more arrays of antenna elements on an antenna aperture. In one embodiment, the antenna elements comprise liquid crystal cells. In one embodiment, the flat panel antenna is a cylindrically fed antenna that includes matrix drive circuitry to uniquely address and drive each of the antenna elements that are not placed in rows and columns. In one embodiment, the elements are placed in rings.

In one embodiment, the antenna aperture having the one or more arrays of antenna elements is comprised of multiple segments coupled together. When coupled together, the combination of the segments form closed concentric rings of antenna elements. In one embodiment, the concentric rings are concentric with respect to the antenna feed.

Examples of Antenna Systems

In one embodiment, the flat panel antenna is part of a metamaterial antenna system. Embodiments of a metamaterial antenna system for communications satellite earth stations are described. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering metamaterial technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering metamaterial unit cells that are part of antenna elements; and (3) a control structure to command formation of an adjustable radiation field (beam) from the metamaterial scattering elements using holographic principles.

Antenna Elements

Figure 18:
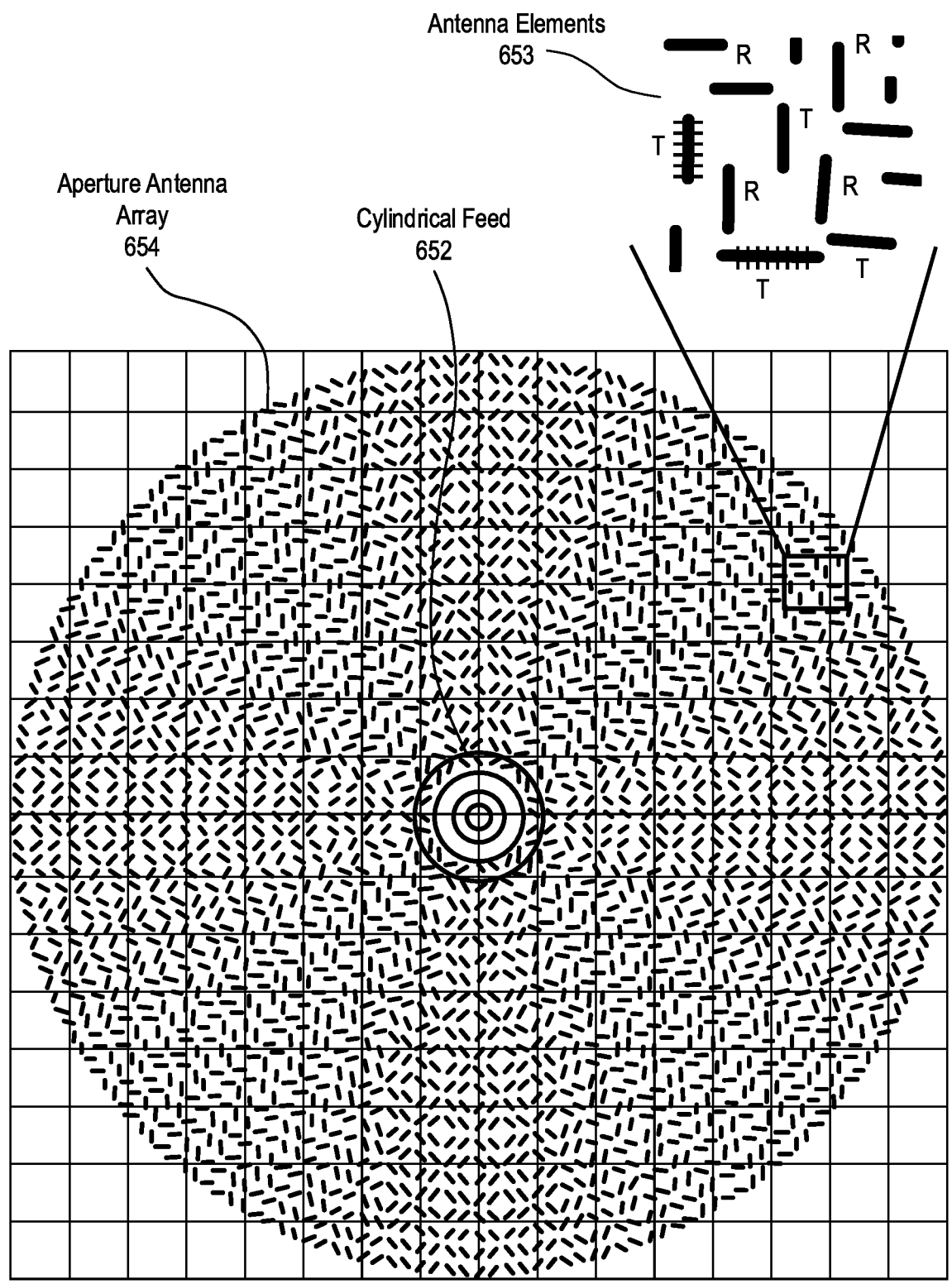
FIG. 18 illustrates the schematic of one embodiment of a cylindrically fed holographic radial aperture antenna.

FIG. 18 illustrates the schematic of one embodiment of a cylindrically fed holographic radial aperture antenna. Referring to FIG. 18, the antenna aperture has one or more arrays 654 of antenna elements 653 that are placed in concentric rings around an input feed 652 of the cylindrically fed antenna. In one embodiment, antenna elements 653 are radio frequency (RF) resonators that radiate RF energy. In one embodiment, antenna elements 653 comprise both Rx and Tx irises that are interleaved and distributed on the whole surface of the antenna aperture. Examples of such antenna elements are described in greater detail below. Note that the RF resonators described herein may be used in antennas that do not include a cylindrical feed.

In one embodiment, the antenna includes a coaxial feed that is used to provide a cylindrical wave feed via input feed 652. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, antenna elements 653 comprise irises and the aperture antenna of FIG. 18 is used to generate a main beam shaped by using excitation from a cylindrical feed wave for radiating irises through tunable liquid crystal (LC) material. In one embodiment, the antenna can be excited to radiate a horizontally or vertically polarized electric field at desired scan angles.

In one embodiment, the antenna elements comprise a group of patch antennas. This group of patch antennas comprises an array of scattering metamaterial elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one embodiment, a liquid crystal (LC) is disposed in the gap around the scattering element. This LC is driven by the direct drive embodiments described above. In one embodiment, liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty-five-degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one embodiment, as discussed above, a matrix drive is used to apply voltage to the patches in order to drive each cell separately from all the other cells without having a separate connection for each cell (direct drive). Because of the high density of elements, the matrix drive is an efficient way to address each cell individually.

In one embodiment, the control structure for the antenna system has 2 main components: the antenna array controller, which includes drive electronics, for the antenna system, is below the wave scattering structure, while the matrix drive switching array is interspersed throughout the radiating RF array in such a way as to not interfere with the radiation. In one embodiment, the drive electronics for the antenna system comprise commercial off-the shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Figure 19:
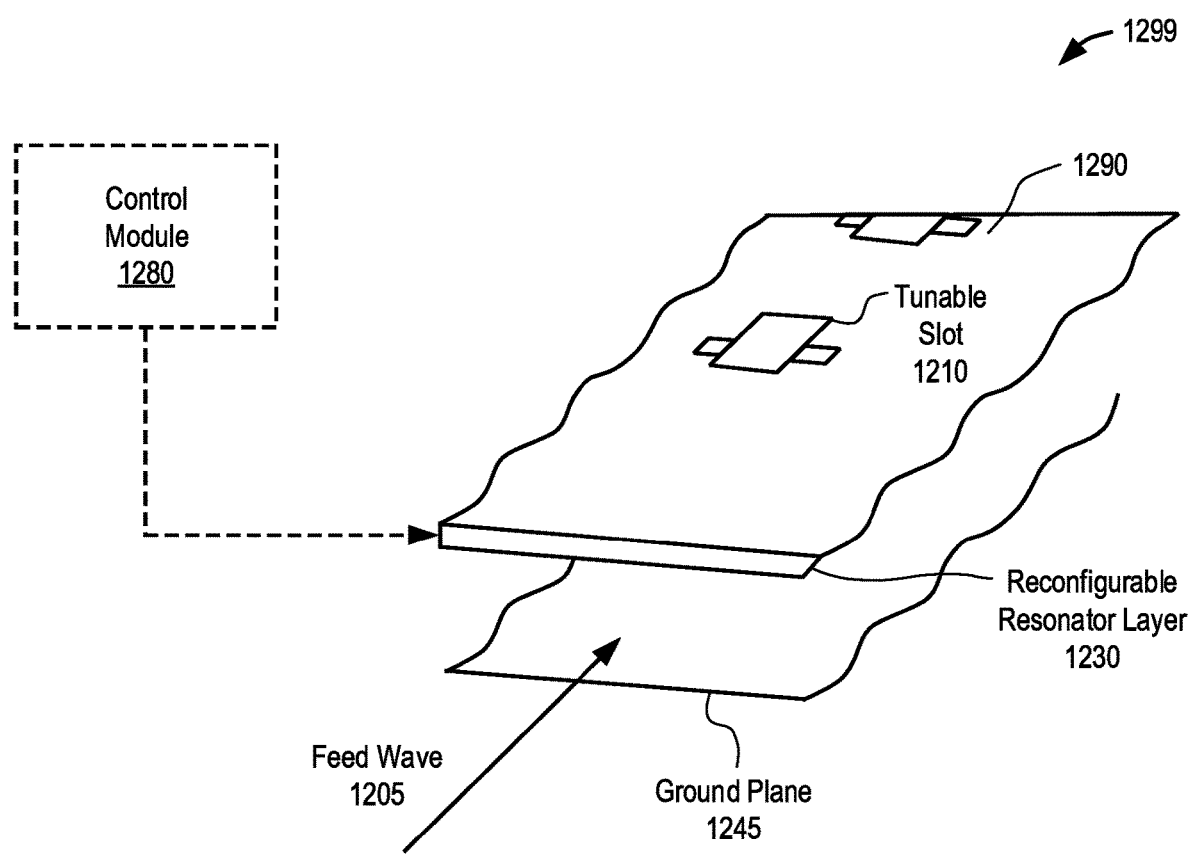
FIG. 19 illustrates a perspective view of one row of antenna elements that includes a ground plane and a reconfigurable resonator layer.

FIG. 19 illustrates a perspective view of one row of antenna elements that includes a ground plane and a reconfigurable resonator layer. Reconfigurable resonator layer 1230 includes an array of tunable slots 1210. The array of tunable slots 1210 can be configured to point the antenna in a desired direction. Each of the tunable slots can be tuned/adjusted by varying a voltage across the liquid crystal.

Figure 20:
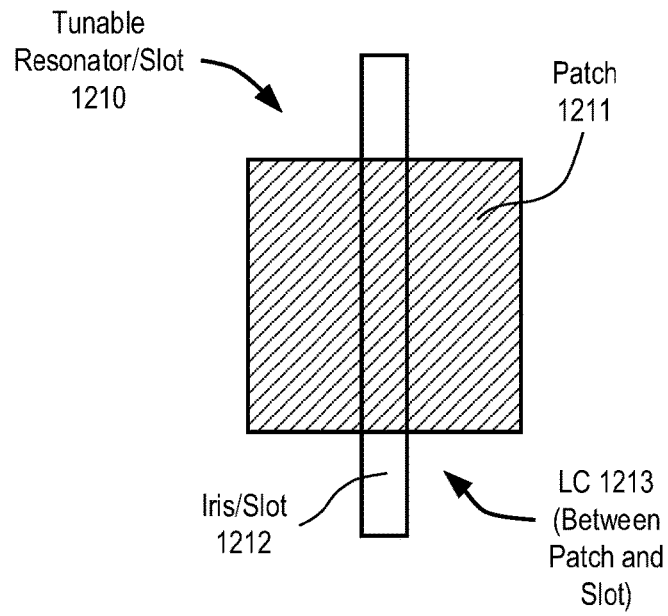
FIG. 20 illustrates one embodiment of a tunable resonator/slot.

Control module 1280 is coupled to reconfigurable resonator layer 1230 to modulate the array of tunable slots 1210 by varying the voltage across the liquid crystal in FIG. 20. Control module 1280 may include a Field Programmable Gate Array ("FPGA"), a microprocessor, a controller, System-on-a-Chip (SoC), or other processing logic. In one embodiment, control module 1280 includes logic circuitry (e.g., multiplexer) to drive the array of tunable slots 1210. In one embodiment, control module 1280 receives data that includes specifications for a holographic diffraction pattern to be driven onto the array of tunable slots 1210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 1280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 1205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 1210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram} = w_{in} * w_{out}$, with $w_{in}$ as the wave equation in the waveguide and $w_{out}$ the wave equation on the outgoing wave.

FIG. 20 illustrates one embodiment of a tunable resonator/slot 1210. Tunable slot 1210 includes an iris/slot 1212, a radiating patch 1211, and liquid crystal 1213 disposed between iris 1212 and patch 1211. In one embodiment, radiating patch 1211 is co-located with iris 1212.

Figure 21:
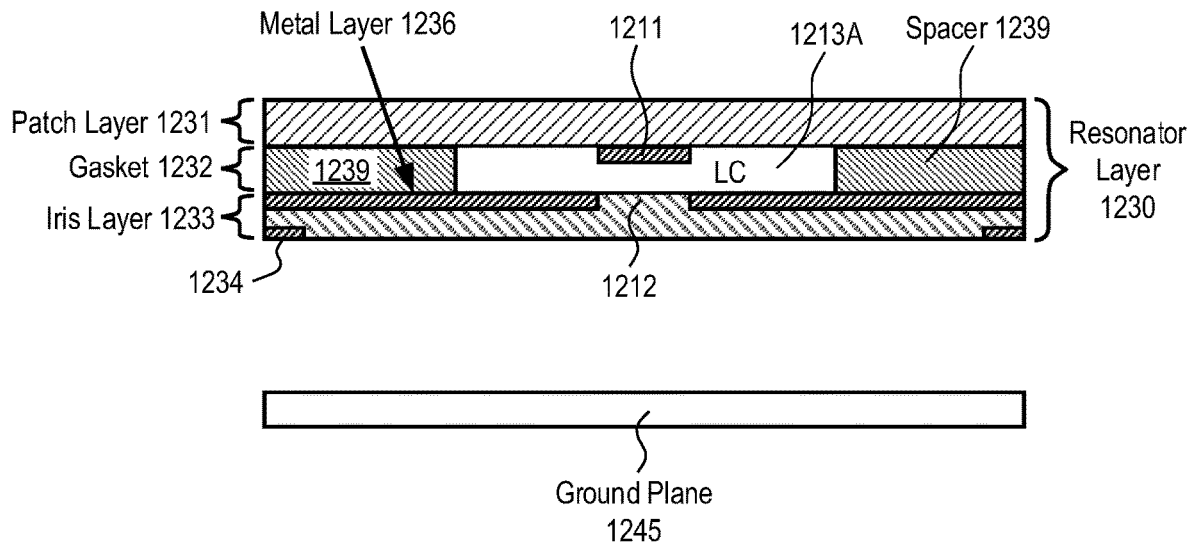
FIG. 21 illustrates a cross section view of one embodiment of a physical antenna aperture.

FIG. 21 illustrates a cross section view of one embodiment of a physical antenna aperture. The antenna aperture includes ground plane 1245, and a metal layer 1236 within iris layer 1233, which is included in reconfigurable resonator layer 1230. In one embodiment, the antenna aperture of FIG. 21 includes a plurality of tunable resonator/slots 1210 of FIG. 20. Iris/slot 1212 is defined by openings in metal layer 1236. A feed wave, such as feed wave 1205 of FIG. 20, may have a microwave frequency compatible with satellite communication channels. The feed wave propagates between ground plane 1245 and resonator layer 1230.

Reconfigurable resonator layer 1230 also includes gasket layer 1232 and patch layer 1231. Gasket layer 1232 is disposed between patch layer 1231 and iris layer 1233. Note that in one embodiment, a spacer could replace gasket layer 1232. In one embodiment, iris layer 1233 is a printed circuit board ("PCB") that includes a copper layer as metal layer 1236. In one embodiment, iris layer 1233 is glass. Iris layer 1233 may be other types of substrates.

Openings may be etched in the copper layer to form slots 1212. In one embodiment, iris layer 1233 is conductively coupled by a conductive bonding layer to another structure (e.g., a waveguide) in FIG. 21. Note that in an embodiment the iris layer is not conductively coupled by a conductive bonding layer and is instead interfaced with a non-conducting bonding layer.

Patch layer 1231 may also be a PCB that includes metal as radiating patches 1211. In one embodiment, gasket layer 1232 includes spacers 1239 that provide a mechanical standoff to define the dimension between metal layer 1236 and patch 1211. In one embodiment, the spacers are 75 microns, but other sizes may be used (e.g., 3-200 mm). As mentioned above, in one embodiment, the antenna aperture of FIG. 21 includes multiple tunable resonator/slots, such as tunable resonator/slot 1210 includes patch 1211, liquid crystal 1213, and iris 1212 of FIG. 20. The chamber for liquid crystal 1213 is defined by spacers 1239, iris layer 1233 and metal layer 1236. When the chamber is filled with liquid crystal, patch layer 1231 can be laminated onto spacers 1239 to seal liquid crystal within resonator layer 1230.

A voltage between patch layer 1231 and iris layer 1233 can be modulated to tune the liquid crystal in the gap between the patch and the slots (e.g., tunable resonator/slot 1210). Adjusting the voltage across liquid crystal 1213 varies the capacitance of a slot (e.g., tunable resonator/slot 1210). Accordingly, the reactance of a slot (e.g., tunable resonator/slot 1210) can be varied by changing the capacitance. The resonant frequency of slot 1210 also changes according to the equation $$f = \frac{1}{2\pi\sqrt{LC}},$$

where f is the resonant frequency of slot 1210 and L and C are the inductance and capacitance of slot 1210, respectively. The resonant frequency of slot 1210 affects the energy radiated from feed wave 1205 propagating through the waveguide. As an example, if feed wave 1205 is 20 GHz, the resonant frequency of a slot 1210 may be adjusted (by varying the capacitance) to 17 GHz so that the slot 1210 couples substantially no energy from feed wave 1205. Or, the resonant frequency of a slot 1210 may be adjusted to 20 GHz so that the slot 1210 couples energy from feed wave 1205 and radiates that energy into free space. Although the examples given are binary (fully radiating or not radiating at all), full gray scale control of the reactance, and therefore the resonant frequency of slot 1210 is possible with voltage variance over a multi-valued range. Hence, the energy radiated from each slot 1210 can be finely controlled so that detailed holographic diffraction patterns can be formed by the array of tunable slots.

In one embodiment, tunable slots in a row are spaced from each other by λ/5. Other spacings may be used. In one embodiment, each tunable slot in a row is spaced from the closest tunable slot in an adjacent row by λ/2, and, thus, commonly oriented tunable slots in different rows are spaced by λ/4, though other spacings are possible (e.g., λ/5, λ/6.3). In another embodiment, each tunable slot in a row is spaced from the closest tunable slot in an adjacent row by λ/3.

Embodiments use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015.

FIGS. 22A-D illustrate one embodiment of the different layers for creating the slotted array. The antenna array includes antenna elements that are positioned in rings, such as the example rings shown in FIG. 18. Note that in this example the antenna array has two different types of antenna elements that are used for two different types of frequency bands.

Figure 22A:
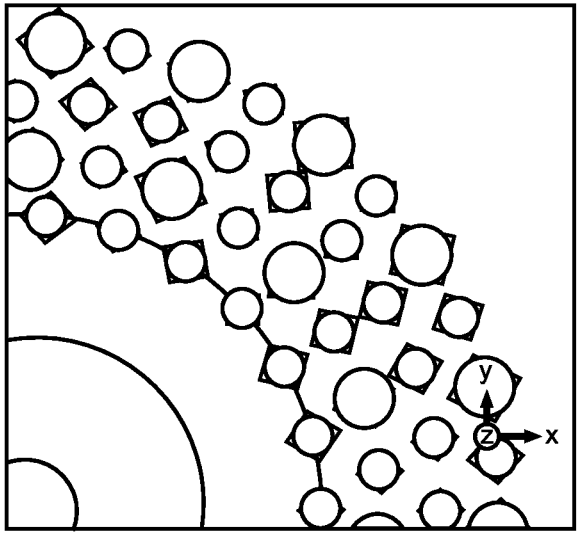
FIGS. 22A-D illustrate one embodiment of the different layers for creating the slotted array.
Figure 22B:
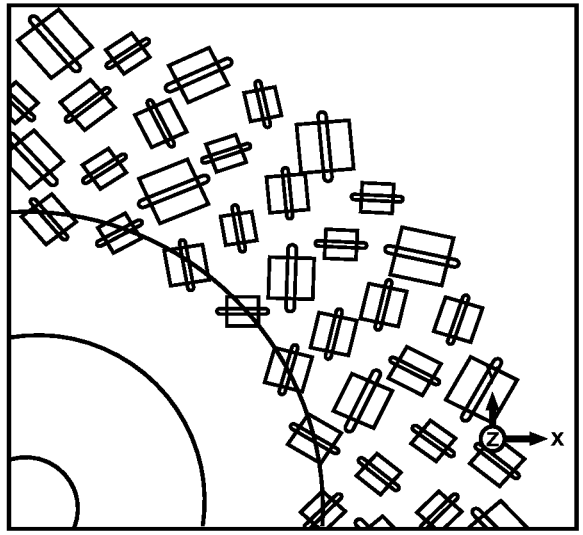
Figure 22C:
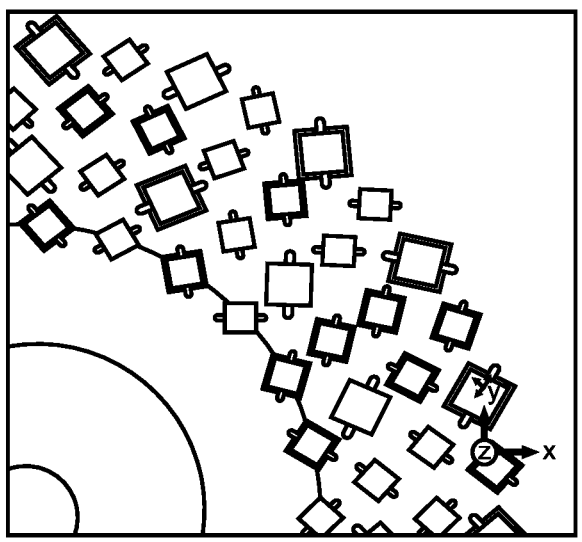
Figure 22D:
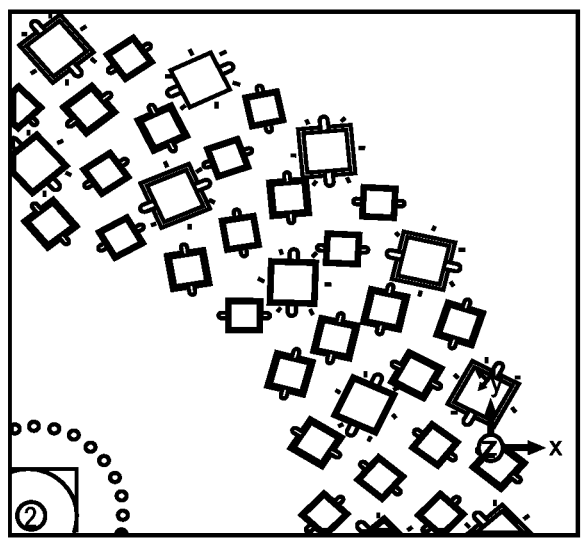

FIG. 22A illustrates a portion of the first iris board layer with locations corresponding to the slots. Referring to FIG. 22A, the circles are open areas/slots in the metallization in the bottom side of the iris substrate, and are for controlling the coupling of elements to the feed (the feed wave). Note that this layer is an optional layer and is not used in all designs. FIG. 22B illustrates a portion of the second iris board layer containing slots. FIG. 22C illustrates patches over a portion of the second iris board layer. FIG. 22D illustrates a top view of a portion of the slotted array.

FIG. 23 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 23 includes a coaxial feed, such as, for example, described in U.S. Publication No. 2015/0236412, entitled "Dynamic Polarization and Coupling Control from a Steerable Cylindrically Fed Holographic Antenna", filed on Nov. 21, 2014.

Referring to FIG. 23, a coaxial pin 1601 is used to excite the field on the lower level of the antenna. In one embodiment, coaxial pin 1601 is a 50 Ω coax pin that is readily available. Coaxial pin 1601 is coupled (e.g., bolted) to the bottom of the antenna structure, which is conducting ground plane 1602.

Separate from conducting ground plane 1602 is interstitial conductor 1603, which is an internal conductor. In one embodiment, conducting ground plane 1602 and interstitial conductor 1603 are parallel to each other. In one embodiment, the distance between ground plane 1602 and interstitial conductor 1603 is 0.1-0.15". In another embodiment, this distance may be λ/2, where λ is the wavelength of the travelling wave at the frequency of operation.

Ground plane 1602 is separated from interstitial conductor 1603 via a spacer 1604. In one embodiment, spacer 1604 is a foam or air-like spacer. In one embodiment, spacer 1604 comprises a plastic spacer.

On top of interstitial conductor 1603 is dielectric layer 1605. In one embodiment, dielectric layer 1605 is plastic. The purpose of dielectric layer 1605 is to slow the travelling wave relative to free space velocity. In one embodiment, dielectric layer 1605 slows the travelling wave by 30% relative to free space. In one embodiment, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 1605, such as periodic sub-wavelength metallic structures that can be machined or lithographically defined, for example.

An RF-array 1606 is on top of dielectric 1605. In one embodiment, the distance between interstitial conductor 1603 and RF-array 1606 is 0.1-0.15". In another embodiment, this distance may be $\lambda_{eff}/2$, where $\lambda_{eff}$ is the effective wavelength in the medium at the design frequency.

The antenna includes sides 1607 and 1608. Sides 1607 and 1608 are angled to cause a travelling wave feed from coax pin 1601 to be propagated from the area below interstitial conductor 1603 (the spacer layer) to the area above interstitial conductor 1603 (the dielectric layer) via reflection. In one embodiment, the angle of sides 1607 and 1608 are at 45° angles. In an alternative embodiment, sides 1607 and 1608 could be replaced with a continuous radius to achieve the reflection. While FIG. 23 shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers.

In operation, when a feed wave is fed in from coaxial pin 1601, the wave travels outward concentrically oriented from coaxial pin 1601 in the area between ground plane 1602 and interstitial conductor 1603. The concentrically outgoing waves are reflected by sides 1607 and 1608 and travel inwardly in the area between interstitial conductor 1603 and RF array 1606. The reflection from the edge of the circular perimeter causes the wave to remain in phase (i.e., it is an in-phase reflection). The travelling wave is slowed by dielectric layer 1605. At this point, the travelling wave starts interacting and exciting with elements in RF array 1606 to obtain the desired scattering.

To terminate the travelling wave, a termination 1609 is included in the antenna at the geometric center of the antenna. In one embodiment, termination 1609 comprises a pin termination (e.g., a 50Ω pin). In another embodiment, termination 1609 comprises an RF absorber that terminates unused energy to prevent reflections of that unused energy back through the feed structure of the antenna. These could be used at the top of RF array 1606.

Figure 24:
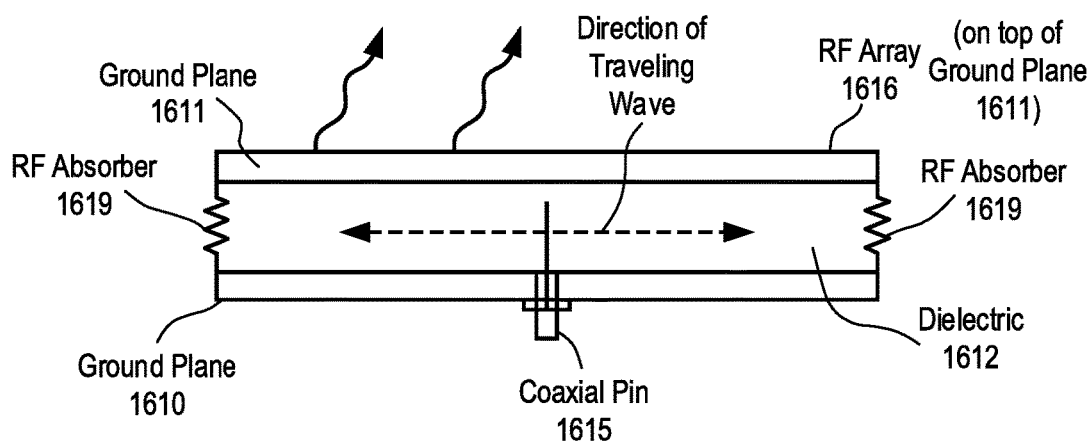
FIG. 24 illustrates another embodiment of the antenna system with an outgoing wave.

FIG. 24 illustrates another embodiment of the antenna system with an outgoing wave. Referring to FIG. 24, two ground planes 1610 and 1611 are substantially parallel to each other with a dielectric layer 1612 (e.g., a plastic layer, etc.) in between ground planes. RF absorbers 1619 (e.g., resistors) couple the two ground planes 1610 and 1611 together. A coaxial pin 1615 (e.g., 50Ω) feeds the antenna. An RF array 1616 is on top of dielectric layer 1612 and ground plane 1611.

In operation, a feed wave is fed through coaxial pin 1615 and travels concentrically outward and interacts with the elements of RF array 1616.

The cylindrical feed in both the antennas of FIGS. 23 and 24 improves the service angle of the antenna. Instead of a service angle of plus or minus forty-five degrees azimuth (±45° Az) and plus or minus twenty-five degrees elevation (±25° El), in one embodiment, the antenna system has a service angle of seventy-five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Embodiments of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 1606 of FIG. 23 and RF array 1616 of FIG. 24 include a wave scattering subsystem that includes a group of patch antennas (e.g., surface scatterers) that act as radiators. This group of patch antennas comprises an array of scattering metamaterial elements.

In one embodiment, each scattering element in the antenna system is part of a unit cell that consists of a lower conductor, a dielectric substrate and an upper conductor that embeds a complementary electric inductive-capacitive resonator ("complementary electric LC" or "CELL") that is etched in or deposited onto the upper conductor.

In one embodiment, a liquid crystal (LC) is injected in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, the liquid crystal acts as an on/off switch for the transmission of energy from the guided wave to the CELC. When switched on, the CELC emits an electromagnetic wave like an electrically small dipole antenna.

Controlling the thickness of the LC increases the beam switching speed. A fifty percent (50%) reduction in the gap between the lower and the upper conductor (the thickness of the liquid crystal) results in a fourfold increase in speed. In another embodiment, the thickness of the liquid crystal results in a beam switching speed of approximately fourteen milliseconds (14 ms). In one embodiment, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one embodiment, the cylindrical feed geometry of this antenna system allows the CELC elements to be positioned at forty-five-degree (45°) angles to the vector of the wave in the wave feed. This position of the elements enables control of the polarization of the free space wave generated from or received by the elements. In one embodiment, the CELCs are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Cell Placement

Figure 25:
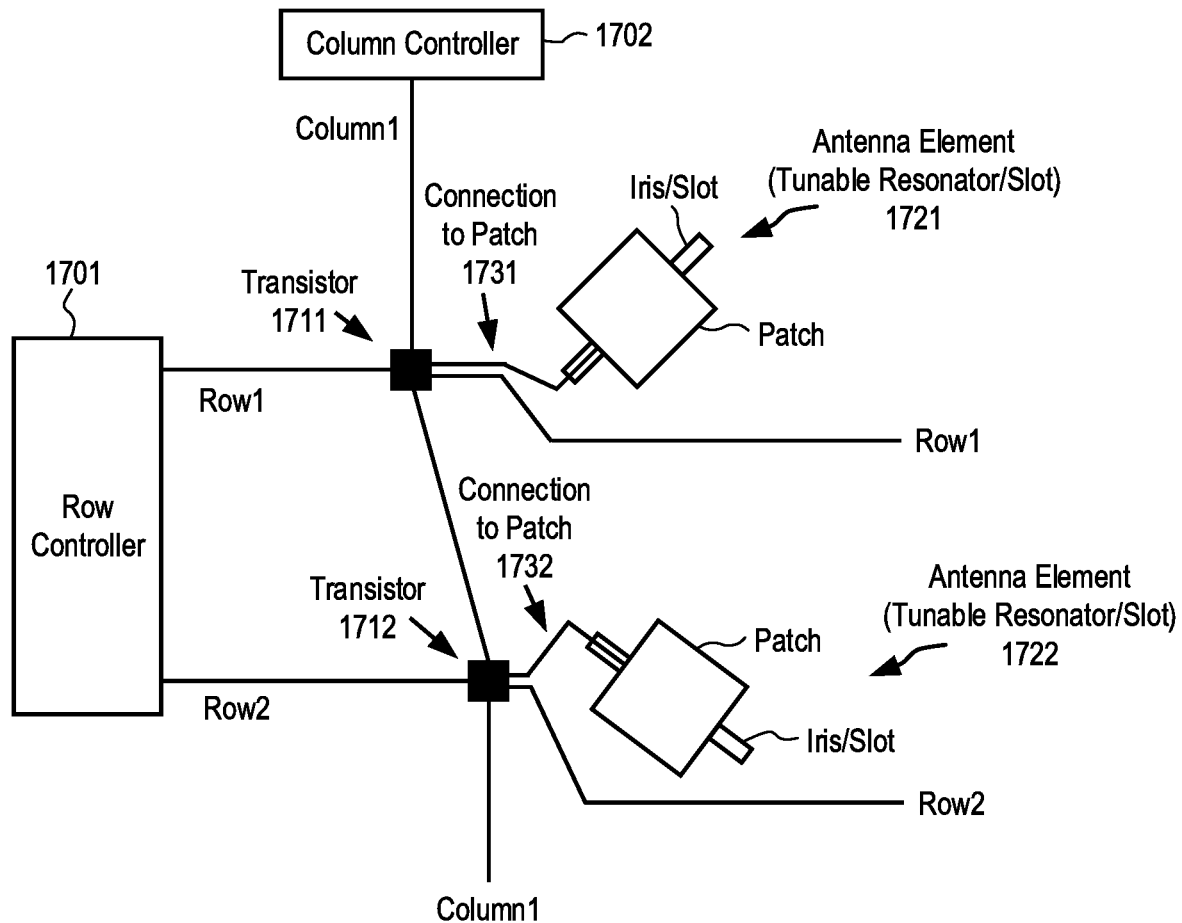
FIG. 25 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 25 illustrates one embodiment of the placement of matrix drive circuitry with respect to antenna elements. Referring to FIG. 25, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In one embodiment, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 26:
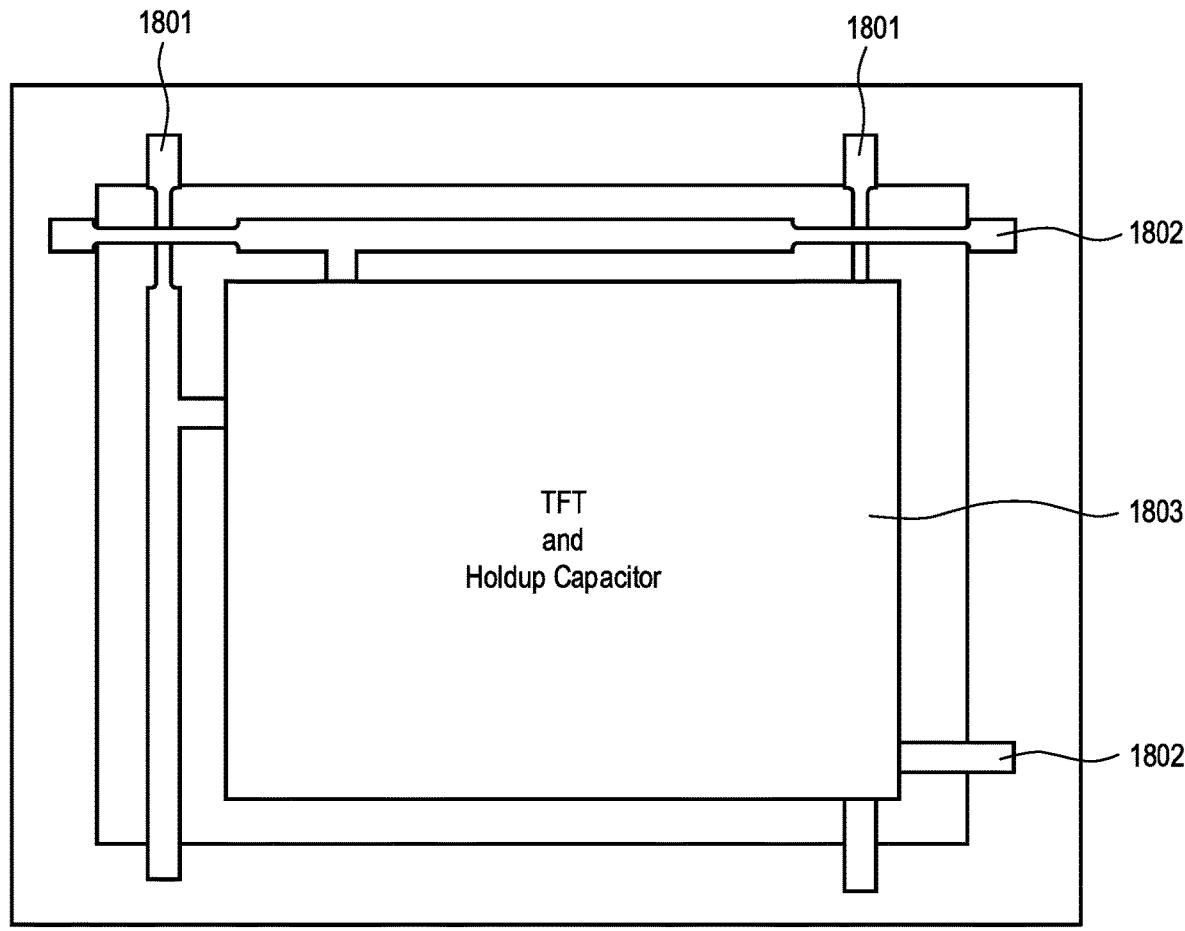
FIG. 26 illustrates one embodiment of a TFT package.

In one embodiment, a TFT package is used to enable placement and unique addressing in the matrix drive. FIG. 26 illustrates one embodiment of a TFT package. Referring to FIG. 26, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

An Example of a Full Duplex Communication System

Figure 27:
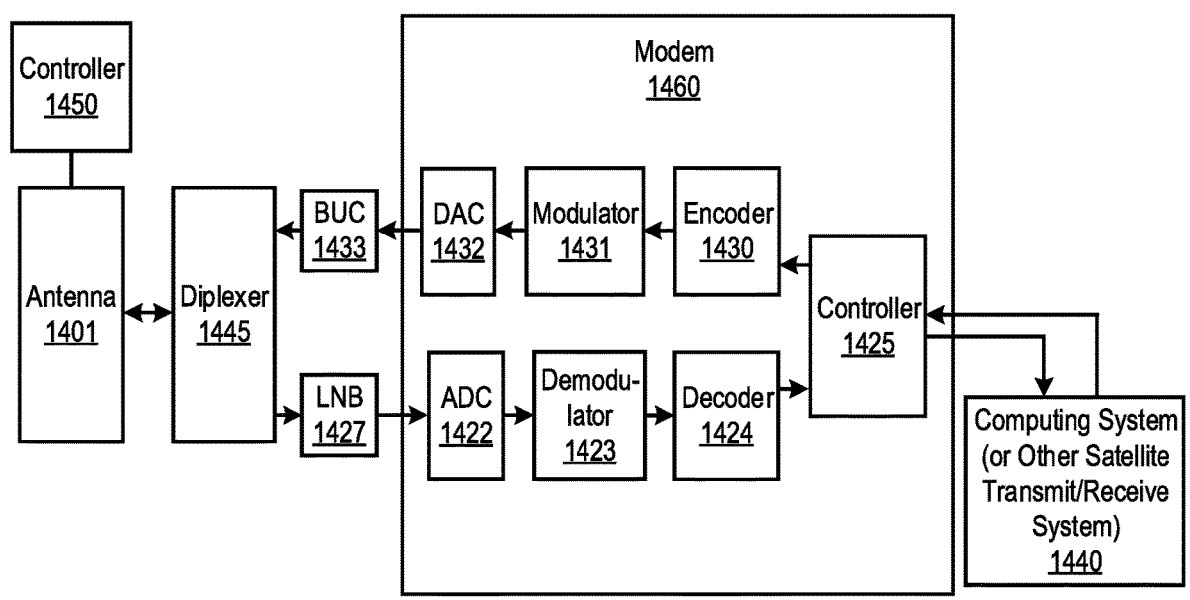
FIG. 27 is a block diagram of one embodiment of a communication system having simultaneous transmit and receive paths.

In another embodiment, the combined antenna apertures are used in a full duplex communication system. FIG. 27 is a block diagram of an embodiment of a communication system having simultaneous transmit and receive paths. While only one transmit path and one receive path are shown, the communication system may include more than one transmit path and/or more than one receive path.

Referring to FIG. 27, antenna 1401 includes two spatially interleaved antenna arrays operable independently to transmit and receive simultaneously at different frequencies as described above. In one embodiment, antenna 1401 is coupled to diplexer 1445. The coupling may be by one or more feeding networks. In one embodiment, in the case of a radial feed antenna, diplexer 1445 combines the two signals and the connection between antenna 1401 and diplexer 1445 is a single broad-band feeding network that can carry both frequencies.

Diplexer 1445 is coupled to a low noise block down converter (LNB) 1427, which performs a noise filtering function and a down conversion and amplification function in a manner well-known in the art. In one embodiment, LNB 1427 is in an out-door unit (ODU). In another embodiment, LNB 1427 is integrated into the antenna apparatus. LNB 1427 is coupled to a modem 1460, which is coupled to computing system 1440 (e.g., a computer system, modem, etc.).

Modem 1460 includes an analog-to-digital converter (ADC) 1422, which is coupled to LNB 1427, to convert the received signal output from diplexer 1445 into digital format. Once converted to digital format, the signal is demodulated by demodulator 1423 and decoded by decoder 1424 to obtain the encoded data on the received wave. The decoded data is then sent to controller 1425, which sends it to computing system 1440.

Modem 1460 also includes an encoder 1430 that encodes data to be transmitted from computing system 1440. The encoded data is modulated by modulator 1431 and then converted to analog by digital-to-analog converter (DAC) 1432. The analog signal is then filtered by a BUC (up-convert and high pass amplifier) 1433 and provided to one port of diplexer 1445. In one embodiment, BUC 1433 is in an out-door unit (ODU).

Diplexer 1445 operating in a manner well-known in the art provides the transmit signal to antenna 1401 for transmission.

Controller 1450 controls antenna 1401, including the two arrays of antenna elements on the single combined physical aperture.

The communication system would be modified to include the combiner/arbiter described above. In such a case, the combiner/arbiter after the modem but before the BUC and LNB.

Note that the full duplex communication system shown in FIG. 27 has a number of applications, including but not limited to, internet communication, vehicle communication (including software updating), etc.

There is a number of example embodiments described herein.

Example 1 is an antenna comprising: an array of antenna elements having liquid crystal (LC); drive circuitry coupled to the array and having a plurality of drivers, each driver of the plurality of drivers coupled to an antenna element of the array and operable to apply a drive voltage to the antenna element; and radio-frequency (RF) ripple correction logic coupled to the drive circuitry to adjust drive voltages to compensate for ripple.

Example 2 is the antenna of example 1 that may optionally include that the RF ripple correction logic is operable to readjust driving voltages for antenna elements of the array to apply a same differential voltage in both a positive frame and a negative frame.

Example 3 is the antenna of example 2 that may optionally include that each driver of the plurality of drivers has an output defined at each gray shade level, of a plurality of gray shade levels, for both negative and positive frames and a gamma voltage controls the output.

Example 4 is the antenna of example 3 that may optionally include that the RF ripple correction logic is operable to perform RF ripple correction at N/2 gray shade levels for N gamma voltage levels, where N is an integer.

Example 5 is the antenna of example 1 that may optionally include that a common voltage is applied to antenna elements in the array, and further wherein the RF ripple correction logic is operable to adjust the common voltage to compensate for ripple.

Example 6 is the antenna of example 1 that may optionally include a controller coupled to the drive circuitry to invert polarity of a differential voltage applied on the LC of the antenna elements periodically.

Example 7 is the antenna of example 6 that may optionally include that the controller is operable to cause the drive circuitry to invert polarity of a differential voltage applied on the LC of antenna elements every frame.

Example 8 is the antenna of example 1 that may optionally include that the RF ripple correction logic is operable to apply voltage adjustments as applied in a free space test (FST) measurement system.

Example 9 is the antenna of example 1 that may optionally include that the RF ripple correction logic is operable to apply voltage adjustments in response to environmental sensors coupled to the array.

Example 10 is a method comprising: determining an initial set of driving voltages for drivers for antenna elements in an array of antenna elements in an antenna; and performing RF ripple correction for antenna elements in the array by adjusting driving voltages in the set of driving voltages.

Example 11 is the method of example 10 that may optionally include applying RF ripple corrected voltages to the antenna elements in the array during operation.

Example 12 is the method of example 11 that may optionally include that voltages in the initial set of voltages are symmetric with respect to an initial value for a common voltage.

Example 13 is the method of example 12 that may optionally include that performing RF ripple correction for antenna elements in the array comprises: (a) measuring RF ripple using a first voltage level; (b) adjusting the common voltage based on a relationship between measured RF ripple and predetermined criteria; (c) repeating (a) and (b) until measured RF ripple satisfies the predetermined criteria; and (d) setting the common voltage to the adjusted common voltage.

Example 14 is the method of example 13 that may optionally include that the first voltage level is based on a highest and lowest gray shade levels.

Example 15 is the method of example 13 that may optionally include that the predetermined criteria are an RF ripple threshold and further wherein adjusting the common voltage is repeated until the RF ripple is below the threshold.

Example 16 is the method of example 13 that may optionally include repeating adjustments to the common voltage for other gray shade levels.

Example 17 is the method of example 10 that may optionally include that the drive voltages are the differential voltages across liquid crystal (LC) in the antenna elements.

Example 18 is the method of example 10 that may optionally include producing adjusted drive voltages by: determining a differential of the common voltage; calculating source voltage corrections based on the differential; and applying the source voltage corrections by adjusting one or more gamma voltage levels.

Example 19 is a non-transitory computer readable storage media having instructions stored thereupon which, when executed by a system having at least a processor and a memory therein, cause the system to perform a method comprising: determining an initial set of driving voltages for drivers for antenna elements in an array of antenna elements in an antenna; and performing RF ripple correction for antenna elements in the array by adjusting driving voltages in the set of driving voltages.

Example 20 is the computer readable storage media of example 19 that may optionally include applying RF ripple corrected voltages to the antenna elements in the array during operation.

Example 21 is the computer readable storage media of example 19 that may optionally include that voltages in the initial set of voltages are symmetric with respect to an initial value for a common voltage.

Example 22 is the computer readable storage media of example 19 that may optionally include that performing RF ripple correction for antenna elements in the array comprises: (a) measuring RF ripple using a first voltage level; (b) adjusting the common voltage based on a relationship between measured RF ripple and predetermined criteria; (c) repeating (a) and (b) until measured RF ripple satisfies the predetermined criteria; and (d) setting the common voltage to the adjusted common voltage.

Example 23 is the computer readable storage media of example 22 that may optionally include that the first voltage level is based on a highest and lowest gray shade levels.

Example 24 is the computer readable storage media of example 22 that may optionally include that the predetermined criteria comprise an RF ripple threshold and further wherein adjusting the common voltage is repeated until the RF ripple is below the threshold.

Example 25 is the computer readable storage media of example 19 that may optionally include repeating adjustments to the common voltage for other gray shade levels.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An antenna comprising:
    an array of antenna elements having liquid crystal (LC);
    drive circuitry coupled to the array and having a plurality of drivers, each driver of the plurality of drivers coupled to an antenna element of the array and operable to apply a drive voltage to the antenna element; and
    radio-frequency (RF) ripple correction logic coupled to the drive circuitry to adjust drive voltages to compensate for ripple.

2. The antenna defined in claim 1 wherein the RF ripple correction logic is operable to readjust driving voltages for antenna elements of the array to apply a same differential voltage in both a positive frame and a negative frame.

3. The antenna defined in claim 2 wherein each driver of the plurality of drivers has an output defined at each gray shade level, of a plurality of gray shade levels, for both negative and positive frames and a gamma voltage controls the output.

4. The antenna defined in claim 3 wherein the RF ripple correction logic is operable to perform RF ripple correction at N/2 gray shade levels for N gamma voltage levels, where N is an integer.

5. The antenna defined in claim 1 wherein a common voltage is applied to antenna elements in the array, and further wherein the RF ripple correction logic is operable to adjust the common voltage to compensate for ripple.

6. The antenna defined in claim 1 further comprising a controller coupled to the drive circuitry to invert polarity of a differential voltage applied on the LC of the antenna elements periodically.

7. The antenna defined in claim 6 wherein the controller is operable to cause the drive circuitry to invert polarity of a differential voltage applied on the LC of antenna elements every frame.

8. The antenna defined in claim 1 wherein the RF ripple correction logic is operable to apply voltage adjustments as applied in a free space test (FST) measurement system.

9. The antenna defined in claim 1 wherein the RF ripple correction logic is operable to apply voltage adjustments in response to environmental sensors coupled to the array.

10. A method comprising:
    determining an initial set of driving voltages for drivers for antenna elements in an array of antenna elements in an antenna, wherein voltages in the initial set of voltages are symmetric with respect to an initial value for a common voltage; and
    performing RF ripple correction for antenna elements in the array by adjusting driving voltages in the set of driving voltages, comprising applying RF ripple corrected voltages to the antenna elements in the array during operation.

11. The method defined in claim 10 wherein performing RF ripple correction for antenna elements in the array comprises:
    (a) measuring RF ripple using a first voltage level;
    (b) adjusting the common voltage based on a relationship between measured RF ripple and predetermined criteria;
    (c) repeating (a) and (b) until measured RF ripple satisfies the predetermined criteria; and
    (d) setting the common voltage to the adjusted common voltage.

12. The method defined in claim 11 wherein the first voltage level is based on a highest and lowest gray shade levels.

13. The method defined in claim 11 wherein the predetermined criteria are an RF ripple threshold and further wherein adjusting the common voltage is repeated until the RF ripple is below the threshold.

14. The method defined in claim 11 further comprising repeating adjustments to the common voltage for other gray shade levels.

15. The method defined in claim 10 wherein the drive voltages are differential voltages across liquid crystal (LC) in the antenna elements.

16. The method defined in claim 10 further comprising producing adjusted drive voltages by:
    determining a differential of a common voltage;
    calculating source voltage corrections based on the differential; and
    applying the source voltage corrections by adjusting one or more gamma voltage levels.

17. A non-transitory computer readable storage media having instructions stored thereupon which, when executed by a system having at least a processor and a memory therein, cause the system to perform a method comprising:
    determining an initial set of driving voltages for drivers for antenna elements in an array of antenna elements in an antenna, wherein voltages in the initial set of voltages are symmetric with respect to an initial value for a common voltage; and
    performing RF ripple correction for antenna elements in the array by adjusting driving voltages in the set of driving voltages.

18. The computer readable storage media defined in claim 17 further comprising applying RF ripple corrected voltages to the antenna elements in the array during operation.

19. The computer readable storage media defined in claim 17 wherein performing RF ripple correction for antenna elements in the array comprises:
    (a) measuring RF ripple using a first voltage level;
    (b) adjusting a common voltage based on a relationship between measured RF ripple and predetermined criteria;
    (c) repeating (a) and (b) until measured RF ripple satisfies the predetermined criteria; and
    (d) setting the common voltage to the adjusted common voltage.

20. The computer readable storage media defined in claim 19 wherein the first voltage level is based on a highest and lowest gray shade levels.

21. The computer readable storage media defined in claim 19 wherein the predetermined criteria comprise an RF ripple threshold and further wherein adjusting the common voltage is repeated until the RF ripple is below the threshold.

22. The computer readable storage media defined in claim 19 further comprising repeating adjustments to the common voltage for other gray shade levels.

* * * * *